(12) United States Patent
Cho et al.

(10) Patent No.: US 8,320,152 B2
(45) Date of Patent: Nov. 27, 2012

(54) INFORMATION STORAGE DEVICES USING MAGNETIC DOMAIN WALL MOVEMENT AND METHODS OF OPERATING THE SAME

(75) Inventors: Young-jin Cho, Suwon-si (KR); Hyung-soon Shin, Seoul (KR); Seung-jun Lee, Seoul (KR); Sun-ae Seo, Hwaseong-si (KR); Sung-chul Lee, Osan-si (KR); Ji-young Bae, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 504 days.

(21) Appl. No.: 12/385,859

(22) Filed: Apr. 22, 2009

(65) Prior Publication Data
US 2010/0008135 A1  Jan. 14, 2010

(30) Foreign Application Priority Data

Jul. 14, 2008 (KR) .................... 10-2008-0068342

(51) Int. Cl.
*G11C 7/00* (2006.01)
(52) U.S. Cl. ............. 365/80; 365/81; 365/171; 365/173
(58) Field of Classification Search .............. 365/80, 365/81, 171, 173, 83–90; 977/933, 935
See application file for complete search history.

(56) References Cited

U.S. PATENT DOCUMENTS

| 7,236,386 B2 | 6/2007 | Parkin | |
|---|---|---|---|
| 2004/0252539 A1* | 12/2004 | Parkin | 365/80 |
| 2008/0080092 A1 | 4/2008 | Kim | |
| 2008/0080234 A1 | 4/2008 | Iwata et al. | |
| 2008/0137395 A1* | 6/2008 | Hwang et al. | 365/80 |
| 2008/0138659 A1* | 6/2008 | Lim et al. | 428/810 |
| 2009/0180210 A1* | 7/2009 | Lee et al. | 360/59 |

FOREIGN PATENT DOCUMENTS

| KR | 2005-257123 | 9/2005 |
| KR | 10 0813270 | 3/2008 |

* cited by examiner

*Primary Examiner* — Alexander Sofocleous
*Assistant Examiner* — Hien Nguyen
(74) *Attorney, Agent, or Firm* — Harness, Dickey & Pierce, P.L.C.

(57) ABSTRACT

An information storage device includes a storage node, a write unit configured to write information to a first magnetic domain region of the storage node, and a read unit configured to read information from a second magnetic domain region of the storage node. The information storage device further includes a temporary storage unit configured to temporarily store information read by the read unit, and a write control unit electrically connected to the temporary storage unit and configured to control current supplied to the write unit. The information read from the second magnetic domain region is stored in the temporary storage unit and written to the first magnetic domain region.

38 Claims, 28 Drawing Sheets

INFORMATION STORAGE DEVICES USING MAGNETIC DOMAIN WALL MOVEMENT AND METHODS OF OPERATING THE SAME

PRIORITY STATEMENT

This non-provisional patent application claims priority under 35 U.S.C. §119 to Korean Patent Application No. 2008-0068342, filed on Jul. 14, 2008, in the Korean Intellectual Property Office, the entire contents of which are incorporated herein by reference.

BACKGROUND

Description of the Related Art

Hard disk drives (HDDs) and nonvolatile random access memories (RAMs) are examples of conventional nonvolatile information storage devices in which recorded information is retained even when power is cut-off.

Conventional HDDs use a rotating part to store information. However, the rotating part may wear down over time, thereby increasing the likelihood of operational failure. As a consequence, reliability of conventional HDDs is reduced.

An example of a conventional non-volatile RAM is a flash memory. While not using a rotating part, a conventional flash memory has relatively slow reading and writing speeds, a relatively short life span, and relatively small storage capacity when compared to a conventional HDD. Flash memories may also have relatively high manufacturing costs.

Another conventional information storage device uses the principle of magnetic domain wall motion of a magnetic material. In these conventional magnetic information storage devices, a minute magnetic region formed of a ferromagnetic substance is referred to as a magnetic domain. A boundary portion between magnetic domains having different magnetization directions is referred to as a magnetic domain wall. The magnetic domains and the magnetic domain walls may be moved by applying current to a magnetic layer.

A conventional information storage device using magnetic domain wall movement has a buffer region (a region for temporarily storing information), which has a length similar to the length of a storage region. Thus, an effective storage capacity of the conventional information storage device is about half a physical storage capacity thereof. Also, in a conventional magnetic information storage device, a read/write operation is performed by moving magnetic domains and magnetic domain walls from the storage region to the buffer region and returning the moved magnetic domains and magnetic domain walls back to the storage region, thereby reducing reading/writing speeds and degrading operating reliability and device performance.

SUMMARY

One or more example embodiments relate to information storage devices using magnetic domain wall movement and methods of operating the same.

One or more example embodiments provide information storage devices using the principle of movement of a magnetic domain and a magnetic domain wall, and methods of operating information storage devices.

According to at least one example embodiment, an information storage device may include: a storage node having a plurality of magnetic domains and magnetic domain walls between the magnetic domains; a write unit configured to write information to a first region of the storage node; a read unit configured to read information from a second region of the storage node; a magnetic domain wall moving unit electrically connected to the storage node, and configured to move the magnetic domain walls; a temporary storage unit electrically connected to the read unit, and configured to temporarily store information read by the read unit; and a write control unit electrically connected to the temporary storage unit and the write unit, and configured to control current supplied to the write unit.

According to at least one example embodiment, an information storage device may include: a storage node including a plurality of magnetic domain regions, and magnetic domain walls arranged between the magnetic domain regions; a write unit configured to write information to a first magnetic domain region of the storage node; a read unit configured to read information from a second magnetic domain region of the storage node; a magnetic domain wall moving unit electrically connected to the storage node, the magnetic domain wall moving unit being configured to move the magnetic domain walls; a temporary storage unit electrically connected to the read unit, the temporary storage unit being configured to temporarily store information read by the read unit; and a write control unit electrically connected to the temporary storage unit and the write unit, the write control unit being configured to control current supplied to the write unit.

According to at least some example embodiments, the first region may be adjacent to a first end of the storage node, and the second region may correspond to a second end of the storage node. The first end of the storage node may be magnetized in a given direction. The information storage device may further include: first through third word lines, and first and second bit lines intersecting the first through third word lines. A first end of the storage node may be connected to the first word line. A second end of the storage node may be connected to one of the first and second bit lines. A first electrode of the write unit, which may be arranged on a bottom of the first region, may be connected to the second word line. A second electrode of the write unit, which may be disposed on a top of the first region, may be connected to the second bit line. A first end of the read unit may be connected to the first bit line. A second end of the read unit may be connected to the third word line. The temporary storage unit may be connected to the first bit line, and the write control unit may be connected to the second bit line.

According to at least some example embodiments, the information storage device may further include: a first switching unit arranged between the first end of the storage node and the first word line; a second switching unit arranged between the first electrode of the write unit and the second word line, wherein the write unit is arranged on the bottom of the first region; and a third switching unit arranged between the second end of the read unit and the third word line.

According to at least some example embodiments, the information storage device may further include: a fourth switching unit arranged between one of the first and second bit lines and the second end of the storage node, wherein the one of the first and second bit lines is connected to the second end of the storage node; and a fourth word line connected to the fourth switching unit.

According to at least some example embodiments, the second word line and the third word line may be connected to a common voltage source. The first word line and the fourth word line may be connected to a common voltage source. The magnetic domain wall moving unit may include: a first current source configured to supply current to the storage node; and a fifth switching unit arranged between the storage node and the first current source. The second end of the storage node may be connected to the first bit line, and the magnetic domain wall moving unit may be connected to the first bit line.

According to at least some example embodiments, the information storage device may further include: a sense unit connected between the temporary storage unit and the read unit. The temporary storage unit may include a latch connected to an output terminal of the sense unit. The sense unit may include: a sense circuit connected to the read unit; another current source arranged between the sense circuit and the read unit, wherein the another current source is configured to supply current to the read unit; and another switching unit arranged between the another current source and the read unit. The write control unit may include: another additional current source configured to supply current to the write unit; another additional switching unit arranged between the other additional current source and the write unit; and a logic unit arranged between the another additional switching unit and the temporary storage unit.

According to example embodiments, the storage node, the first through fourth word lines, the first and second bit lines, and the first through fourth switching units may form a unit memory region. A plurality of the unit memory regions may be arranged to form a memory array. A peripheral circuit may be arranged to drive and control the memory array. The magnetic domain wall moving unit, the temporary storage unit, and the write control unit may be included in the peripheral circuit region. A decoder may be arranged between the memory array and the peripheral circuit. The second end of the storage node may be connected to the first of the plurality of bit lines, and the magnetic domain wall moving unit may be connected to the first of the plurality of bit lines.

At least one other example embodiment provides a method of operating an information storage device. The information storage device may include: a storage node having a plurality of magnetic domains and magnetic domain walls between the magnetic domain regions; a write unit arranged in a first region of the storage node adjacent to a first end of the storage node. The first end of the storage node may serve as a first magnetic domain region magnetized in a first direction. According to at least this example embodiment, the method may include: recording first information by magnetizing the first region in a direction opposite to the first direction by using the write unit; and moving the first information by 1 bit toward a second end of the storage node while extending the first magnetic domain region to the first region by supplying current to the storage node.

At least one other example embodiment provides a method of operating an information storage device. The information storage device may include: a storage node having a plurality of magnetic domains and magnetic domain walls between the magnetic domains; a write unit configured to write information to a first region of the storage node; a read unit configured to read information from a second region of the storage node; a magnetic domain wall moving unit configured to move the magnetic domain walls; a temporary storage unit configured to temporarily store information read by the read unit; and a write control unit electrically connected to the temporary storage unit and configured to control current supplied to the write unit. According to at least this example embodiment, the method may include: a first operation of reproducing or reading information from the second region and storing the reproduced information in the temporary storage unit; and a second operation of moving the magnetic domain walls of the storage node by 1 bit toward the second region.

According to at least some example embodiments, the method may further include: a third operation of selectively writing information to the first region by using the write control unit and the write unit. The information written to the first region in the third operation may be the same as the information reproduced (or read) in the first operation. In the second operation, the first magnetic domain may extend to the first region, and a write current may not be supplied to the first region in the third operation if the information reproduced in the first operation corresponds to information stored in the first magnetic domain. If the information reproduced in the first operation does not correspond to information stored in the first magnetic domain, a write current may be supplied to the first region in the third operation.

After the second operation, the method may further include: a third operation of selectively writing the information reproduced in the first operation to the first region while (e.g., concurrently or simultaneously with) reproducing the information from the second region. If the information reproduced in the first operation corresponds to information stored in the first magnetic domain, a write current need not be supplied to the first region in the third operation. If the information reproduced in the first operation does not correspond to information stored in the first magnetic domain, the write current may be supplied to the first region in the third operation.

At least one other example embodiment provides an information storage device. The information storage device may include: a storage node including a plurality of magnetic domains; a write unit arranged at a first magnetic domain region of the storage node adjacent to a first end of the storage node; and a read unit arranged at a second magnetic domain region of the storage node. A magnetic domain wall may be arranged between each pair of adjacent magnetic domains of the storage node. The first end of the storage node may be magnetized in a first magnetization direction, and the second magnetic domain region may be at a second end of the storage node.

According to at least some example embodiments, the first magnetization direction may represent a first information type, and the write unit may be configured to write information to the first magnetic domain region by selectively applying a write current to the first magnetic domain region. The information may correspond to the first or a second magnetization direction. In one example, the write unit applies the write current to the first magnetic domain region only if the information corresponds to the second magnetization direction.

According to at least some example embodiments, the write unit and the read unit may be coupled to the same or different bit lines. The write unit may include: a first separation layer arranged on a first surface of the first magnetic domain region; a first pinned layer arranged on the first separation layer; a first electrode layer arranged on the first pinned layer; and a second electrode layer arranged on a second surface of the first magnetic domain region. The first pinned layer may have a fixed magnetization direction. The second surface may be opposite to the first surface. The first end of the storage node may be coupled to a first ground via a first switching device. The first electrode layer may be coupled to a first bit line. The second electrode layer may be coupled to the first ground via a second switching device.

According to at least some example embodiments, the read unit may include: a first separation layer arranged on a surface of the second magnetic domain region; a first electrode layer arranged on the separation layer; a pinned layer arranged on the first electrode layer; a second separation layer arranged on the pinned layer; a first free layer arranged on the second separation layer; and a second electrode layer arranged on the first free layer. The pinned layer may have a fixed magnetization direction. The second end of the storage node may be coupled to a first bit line, and the second electrode may be coupled to ground via a first switching device. The first electrode layer may be coupled to the first bit line. The second end of the storage node may be coupled to the first bit line via a second switching device. The first electrode layer may be coupled to a second bit line. The second end of the storage node may be coupled to the first bit line via a second switching device.

According to at least some example embodiments, the first end of the storage node may be coupled to ground via a first switching device, and the first switching device may be selectively activated and deactivated via a first word line. The second end of the storage node may be coupled to a first bit line via a second switching device, and may be selectively activated and deactivated via a second word line. Each of the first and second word lines may be connected to a common word line.

According to at least some example embodiments, all of the plurality of magnetic domains may serve as an effective storage region of the storage node. Alternatively, all of the plurality of magnetic domains, other than a magnetic domain region at the first end of the storage node, may serve as an effective storage region of the storage node.

According to at least some example embodiments, the first end of the storage node may be connected to a first ground via a first switching device, the write unit may be connected to the first ground via a second switching device, and the read unit may be connected to a second ground via a third switching device. The first ground and the second ground may be coupled to a common ground. The second end of the storage node may be connected to a first bit line via a fourth switching device, and the first and fourth switching devices may be selectively activated and deactivated via a common word line. The second and third switching devices may be selectively activated and deactivated via a common word line.

According to at least some example embodiments, the information storage device may further include a plurality of word lines and a plurality of bit lines intersecting the plurality of word lines. A first end of the storage node may be connected to a first of the plurality of word lines. A second end of the storage node may be connected to one of a first and a second ones of the plurality of bit lines. A first electrode of the write unit may be connected to a second of the plurality of word lines. A second electrode of the write unit may be connected to the second of the plurality of bit lines. A first electrode of the read unit may be connected to one of the first and second of the plurality of bit lines. A second electrode of the read unit may be connected to a third of the plurality of word lines.

The information storage device may further include first, second and third switching units. The first switching unit may be arranged between the first end of the storage node and the first of the plurality of word lines. The second switching unit may be arranged between the first electrode of the write unit and the second of the plurality of word lines. The third switching unit may be arranged between the second electrode of the read unit and the third of the plurality of word lines.

A fourth switching unit may be arranged between the first or second of the plurality of bit lines, which is connected to the second end of the storage node, and the second end of the storage node. A fourth of the plurality of word lines may be connected to the fourth switching unit.

A magnetic domain wall moving unit may be electrically connected to the storage node. The magnetic domain wall moving unit may be configured to move the magnetic domain walls. A temporary storage unit electrically connected to the read unit may be configured to temporarily store information read by the read unit. A write control unit electrically connected to the temporary storage unit and the write unit may be configured to control current supplied to the write unit. The write control unit may include a current source, a switching unit and a logic device. The current source may be configured to supply current to the write unit. The switching unit may be connected between the current source and the write unit. The logic device may be connected between the switching unit and the temporary storage unit.

According to at least some example embodiments, a sense unit may be connected between the temporary storage unit and the read unit. The temporary storage unit may include a latch connected to an output terminal of the sense unit.

BRIEF DESCRIPTION OF THE DRAWINGS

The present invention will become apparent and more readily appreciated from the following description of the example embodiments shown in the drawings in which.

DETAILED DESCRIPTION OF EXAMPLE EMBODIMENTS

Figure 1:
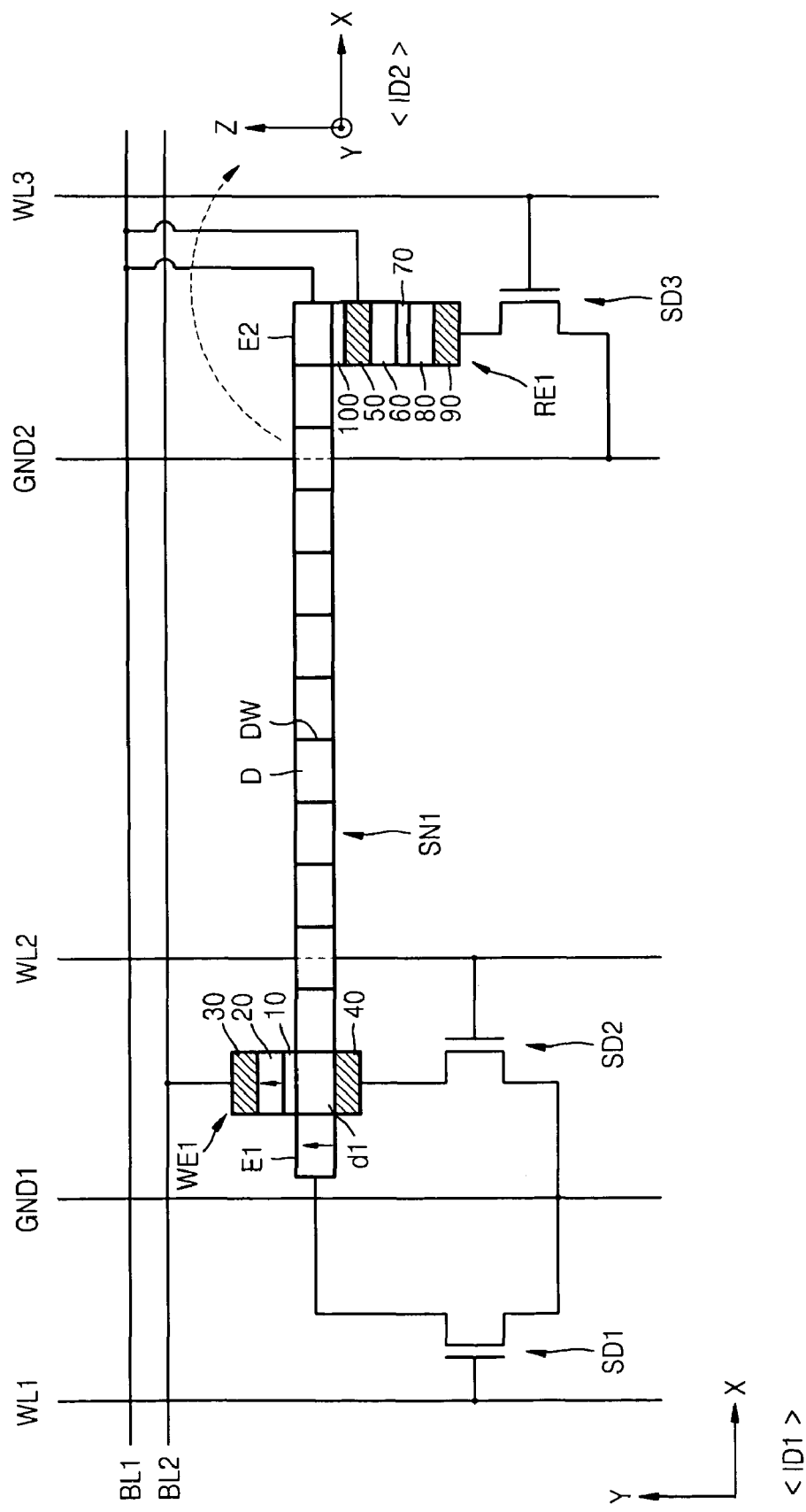
FIGS. 1 through 6 illustrate information storage devices using magnetic domain wall movement according to example embodiments.

Various embodiments of the present invention will now be described more fully with reference to the accompanying drawings.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments may be modified and take alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms, 'first', 'second', etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 illustrates an information storage device using magnetic domain wall movement according to an example embodiment. In FIG. 1, first and second direction indicators ID1 and ID2 are used for convenience of explanation. The first direction indicator ID1 relates to first through third word lines WL1, WL2 and WL3 and first and second bit lines BL1 and BL2. The second direction indicator ID2 relates to a storage node SN1, a write unit or element WE1 and a read unit or element RE1.

Referring to FIG. 1, the first through third word lines WL1, WL2, and WL3 extend in a given, desired or predetermined direction, for example, in the Y-axis direction of the first direction indicator ID1. The first and second bit lines BL1 and BL2 extend in a direction perpendicular or substantially perpendicular to the first through third word lines WL1, WL2, and WL3. A first ground line GND1 may be arranged between the first word line WL1 and the second word line WL2. A second ground line GND2 may be arranged between the second word line WL2 and the third word line WL3.

A storage node SN1 may be connected to the first word line WL1 and the first bit line BL1. For example, the storage node SN1 may be a linear magnetic track extending in the X-axis direction of the second direction indicator ID2. The linear magnetic track may include a plurality of magnetic domain regions D arranged in a line. A magnetic domain wall region DW may separate adjacent magnetic domain regions D. First and second ends E1 and E2 of the storage node SN1 may be connected to the first word line WL1 and the first bit line BL1, respectively. The first end E1 of the storage node SN1 may be magnetized in a given, desired or predetermined direction, for example, in the direction of the Z-axis of the second direction indicator ID2. An arrow marked at the first end E1 of the storage node SN1 indicates the direction in which the storage node SN1 is magnetized. A first switching device SD1 may be located between the first end E1 of the storage node SN1 and the first word line WL1. The first switching device SD1 may be a transistor, and in this example, the gate, source, and drain of the first switching device SD1 may be connected to the first word line WL1, the storage node SN1 and the first ground line GND1, respectively.

The write element WE1 may write information to the storage node SN1. The write element WE1 may be arranged on a magnetic domain region of the storage node SN1 (hereinafter referred to as a first region d1) next to (or adjacent to) the first end E1 of the storage node SN1. If the write element WE1 is aligned with the first region d1, the remaining regions of the storage node SN1 (except for the first end E1) may serve as an effective storage region, which will be described in more detail below. Alternatively, the write element WE1 may be aligned with the first end E1 of the storage node SN1, but not in the first region d1. In this example, the entire storage node SN1 may be an effective storage region. For example, the write element WE1 may be a device for recording information according to the tunnel magnetoresistance (TMR) effect or the giant magnetoresistance (GMR) effect, each of which are well-known in the art. In one example, the write element WE1 may include a first separation layer 10, a first pinned layer 20 and a first electrode layer 30 that are sequentially deposited on one of an upper surface and a lower surface (e.g., on the upper surface) of the first region d1. A second electrode layer 40 may be formed on the other of the upper and lower surfaces of the first region d1 (e.g., on the lower surface). The second electrode layer 40 may be included in the write element WE1.

If the write element WE1 is a TMR device, then the first separation layer 10 may be an insulating layer. If the write element WE1 is a GMR device, then the first separation layer 10 may be a conductive layer. The first pinned layer 20 may be a ferromagnetic layer. The magnetization direction of the first pinned layer 20 may be pinned in a given, desired or predetermined direction. For example, the first pinned layer 20 may be magnetized in the Z-axis direction of the second direction indicator ID2. The first region d1 on which the write element WE1 is arranged is a free layer. The magnetization direction of the free layer may change according to the direction of write current flowing through the first region d1. For example, the magnetization direction of the first region d1 may change according to the direction of the write current flowing between the first electrode layer 30 and the second electrode layer 40. Such a change in the magnetization direction may occur according to the general GMR or TMR effect, and thus will not be described here in detail.

Although not shown in FIG. 1, if the first separation layer 10 is a conductive layer, a resistive layer having a higher electrical resistance than the storage node SN1 may be arranged between the first region d1 and the first separation layer 10. When current is applied between the first and second ends E1 and E2 of the storage node SN1 to move magnetic domains and magnetic domain walls, the resistive layer may suppress and/or prevent current from leaking into the first electrode layer 30. A layer similar or substantially similar to the resistive layer may also be arranged between the first region d1 and the second electrode layer 40. Also, at least one layer may be arranged between the first pinned layer 20 and the first electrode layer 30 to fix the magnetization direction of the first pinned layer 20. The at least one layer may include an anti-ferromagnetic layer. Another free layer may also be arranged between the first region d1 and the first separation layer 10. The structure and elements of the write element WE1 may be changed or diversified. For example, the locations of the write element WE1 and the second electrode layer 40 may be switched with each other. In this example, a pinned layer under the first region d1 may be magnetized in the direction opposite to the direction of the Z-axis. Also, the write element WE1 may have a structure in which a pinned layer is formed on and under the storage node SN1. In this example, the directions of magnetization of the double-pinned structure may be opposite to each other.

One end of the write element WE1 (e.g., the first electrode layer 30) may be connected to the second bit line BL2, and the second electrode layer 40 may be connected to the second word line WL2. In this example, the second electrode layer 40 may be referred to as the other end of the write element WE1. A second switching device SD2 may be arranged between the second electrode layer 40 and the second word line WL2. The second switching device SD2 may be a transistor. In this example, the gate, source and drain of the second switching device SD2 may be connected to the second word line WL2, the second electrode layer 40 and the first ground line GND1, respectively. The drains of the first switching device SD1 and the second switching device SD2 may be commonly connected to the first ground line GND1, and thus, the drains may be formed as a single common drain.

The read element RE1 may read information from the storage node SN1. The read element RE1 may be located at the second end E2 of the storage node SN1. The read element RE1 may be a sensor reproducing information from the second end E2 of the storage node SN1 according to the TMR or GMR effect. In one example, the read element RE1 may be arranged on the top or bottom of the second end E2 of the storage node SN1. The read element RE1 may include a third electrode layer 50, a second pinned layer 60, a second separation layer 70, a first free layer 80 and a fourth electrode layer 90, which are sequentially deposited on the second end E2. Current (or electrical resistance) between the third electrode layer 50 and the fourth electrode layer 90 of the read element RE1 may change according to the magnetization direction of a magnetic domain located at the second end E2 of the storage node SN1. A third separation layer 100 may be disposed between the read element RE1 and the second end E2 of the storage node SN1. The third separation layer 100 may be an insulating layer, or a resistive layer (non-insulating layer) having higher electrical resistance than the storage node SN1.

A first end of the read element RE1 (e.g., the third electrode layer 50) may be connected to the first bit line BL1. A second end of the read element RE1 (e.g., the fourth electrode layer 90) may be connected to the third word line WL3. A third switching device SD3 may be disposed between the fourth electrode layer 90 and the third word line WL3. The third switching device SD3 may be a transistor. In this case, the gate, source and drain of the third switching device SD3 may be connected to the third word line WL3, the fourth electrode layer 90 and the second ground line GND2, respectively.

Figure 2:
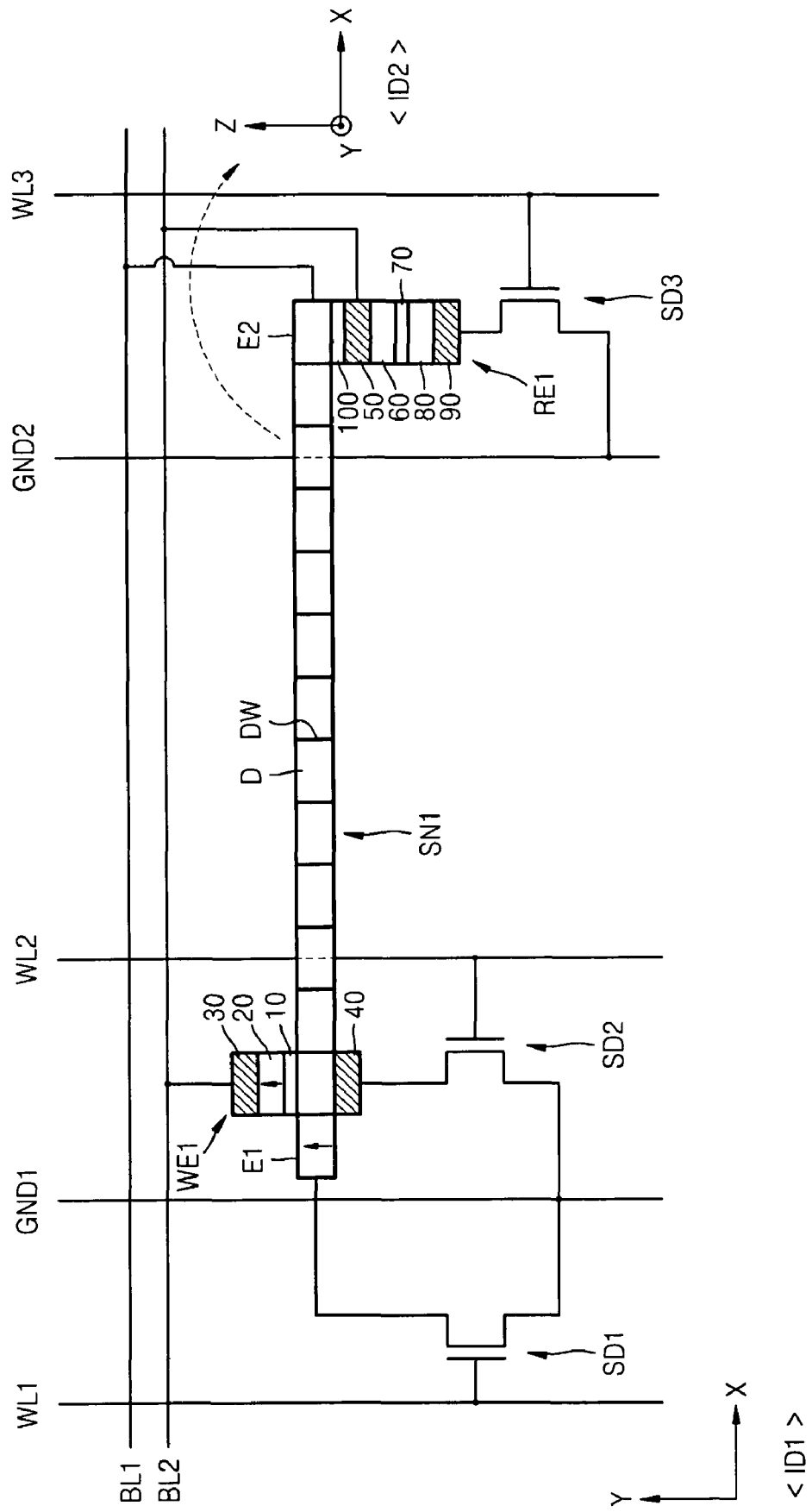

According to at least one other example embodiment, the first end (the third electrode layer 50) of the read element RE1 may be connected to the second bit line BL2 as illustrated in FIG. 2. In this example, the second bit line BL2 is a common bit line to which both the write element WE1 and the read element RE1 are connected.

Figure 3:
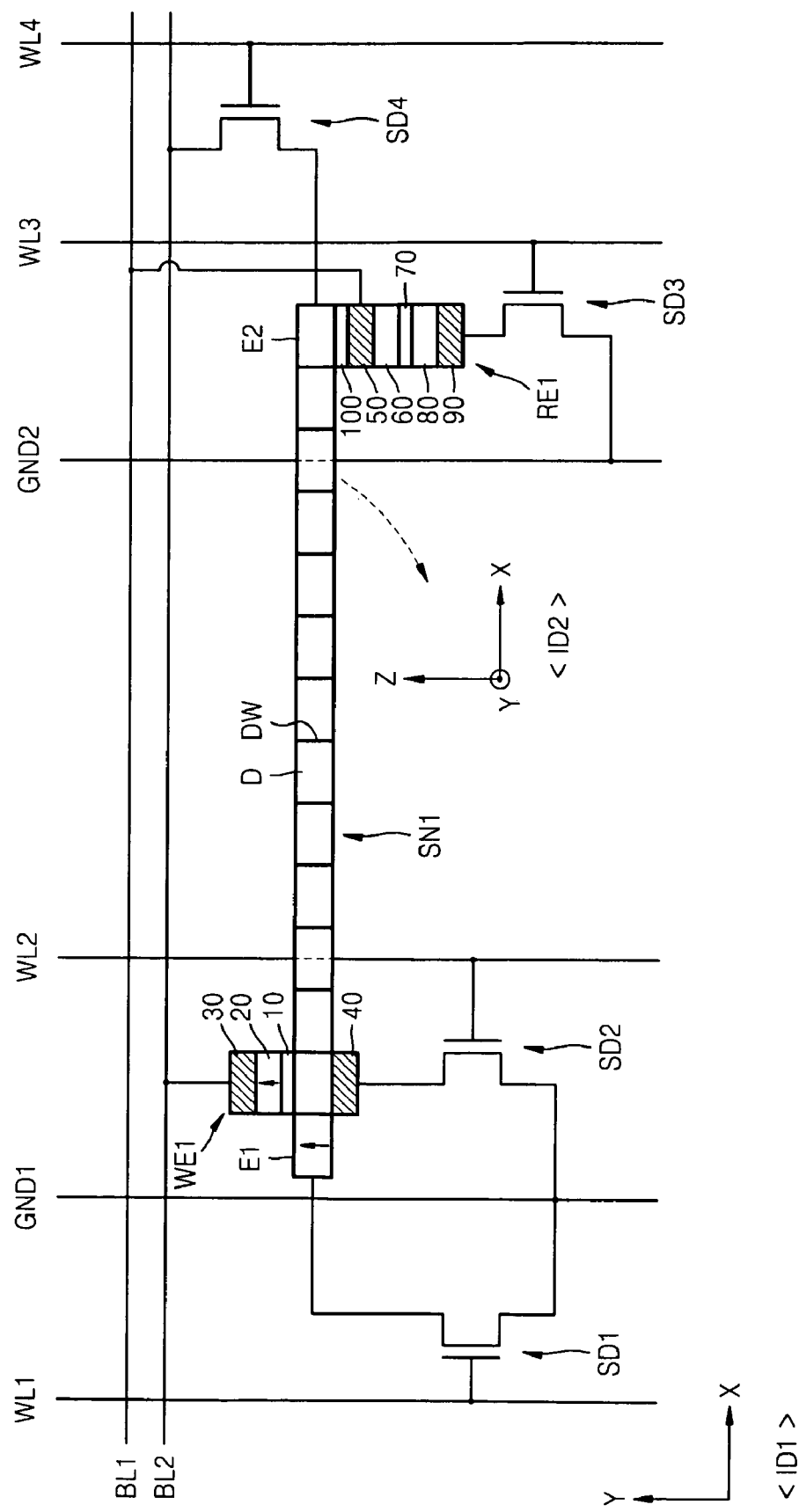

A fourth switching device SD4 and a fourth word line WL4 may be included in the information storage device, as illustrated in FIG. 3.

Referring to FIG. 3, the fourth word line WL4 may be spaced apart from the third word line WL3. The fourth switching device SD4 may be arranged at a point at which the fourth word line WL4 and the second bit line BL2 intersect. The second end E2 of the storage node SN1 and the second bit line BL2 may be connected to one another via the fourth switching device SD4 disposed therebetween. The fourth switching device SD4 may be a transistor. In this case, the gate, source and drain of the fourth switching device SD4 may be connected to the fourth word line WL4, the second bit line BL2 and the second end E2 of the storage node SN1, respectively.

Figure 4:
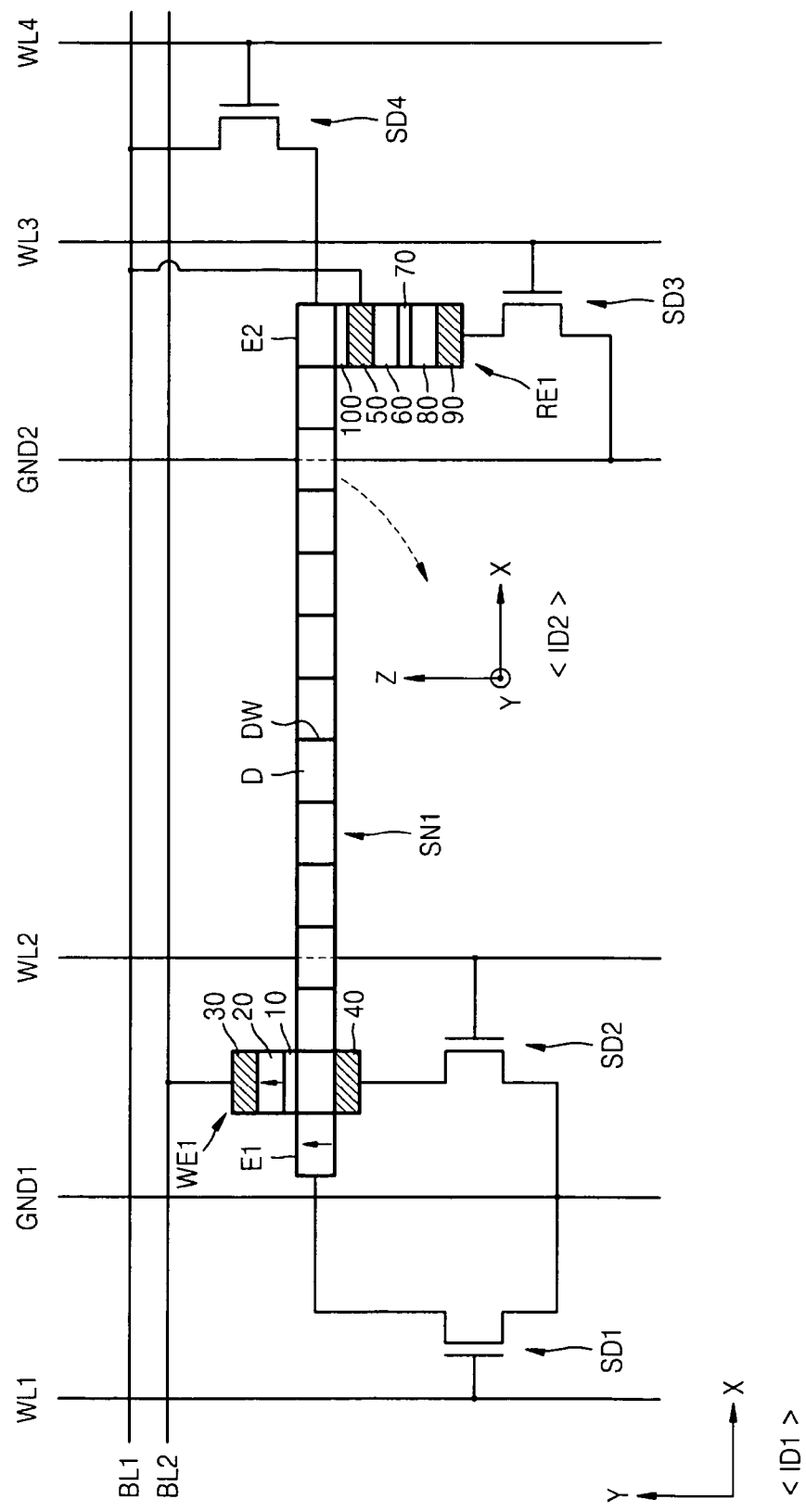

The fourth switching device SD4 may be connected to the first bit line BL1 rather than the second bit line BL2, as illustrated in FIG. 4.

In FIGS. 3 and 4, the first word line WL1 and the fourth word line WL4 may be connected to each other so that the same signal may be applied thereto. Similarly, the second word line WL2 and the third word line WL3 may be connected to each other so that the same signal may be applied thereto. Also, the first ground line GND1 and the second ground line GND2 may be connected via a common ground line.

Figure 5:
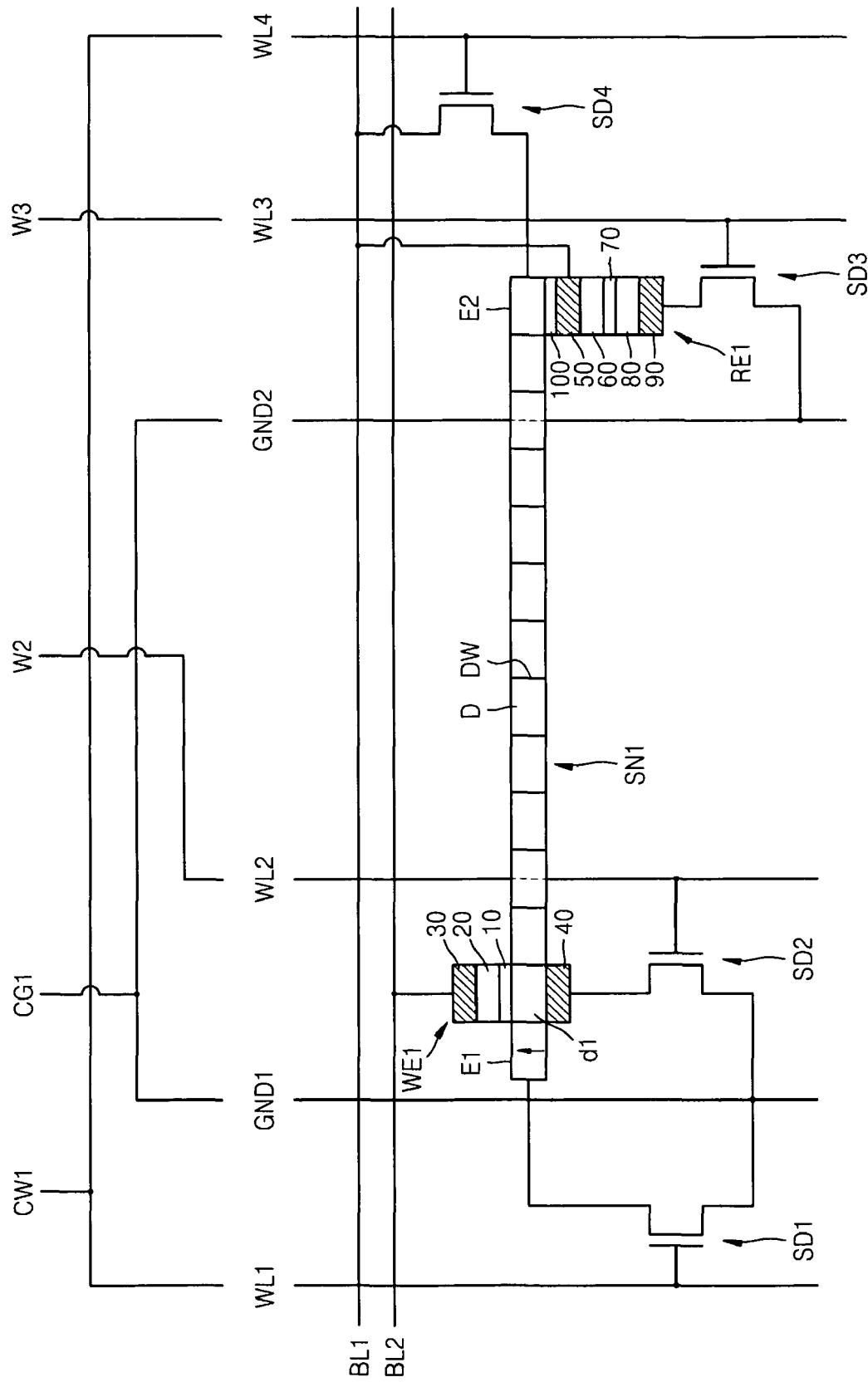

FIG. 5 illustrates an information storage device similar to the information storage device shown in FIG. 4, except that the first word line WL1 and the fourth word line WL4 are connected via a first common interconnecting wire CW1, and the first ground line GND1 and the second ground line GND2 are connected via a first common ground line CG1. In this example, the first word line WL1 and the fourth word line WL4 may be connected to a common voltage source, and thus, the same signal may be applied to the first word line WL1 and the fourth word line WL4. In FIG. 5, 'W2' denotes a second interconnecting wire connected to a second word line WL2, and 'W3' denotes a third interconnecting wire connected to a third word line WL3.

Figure 6:
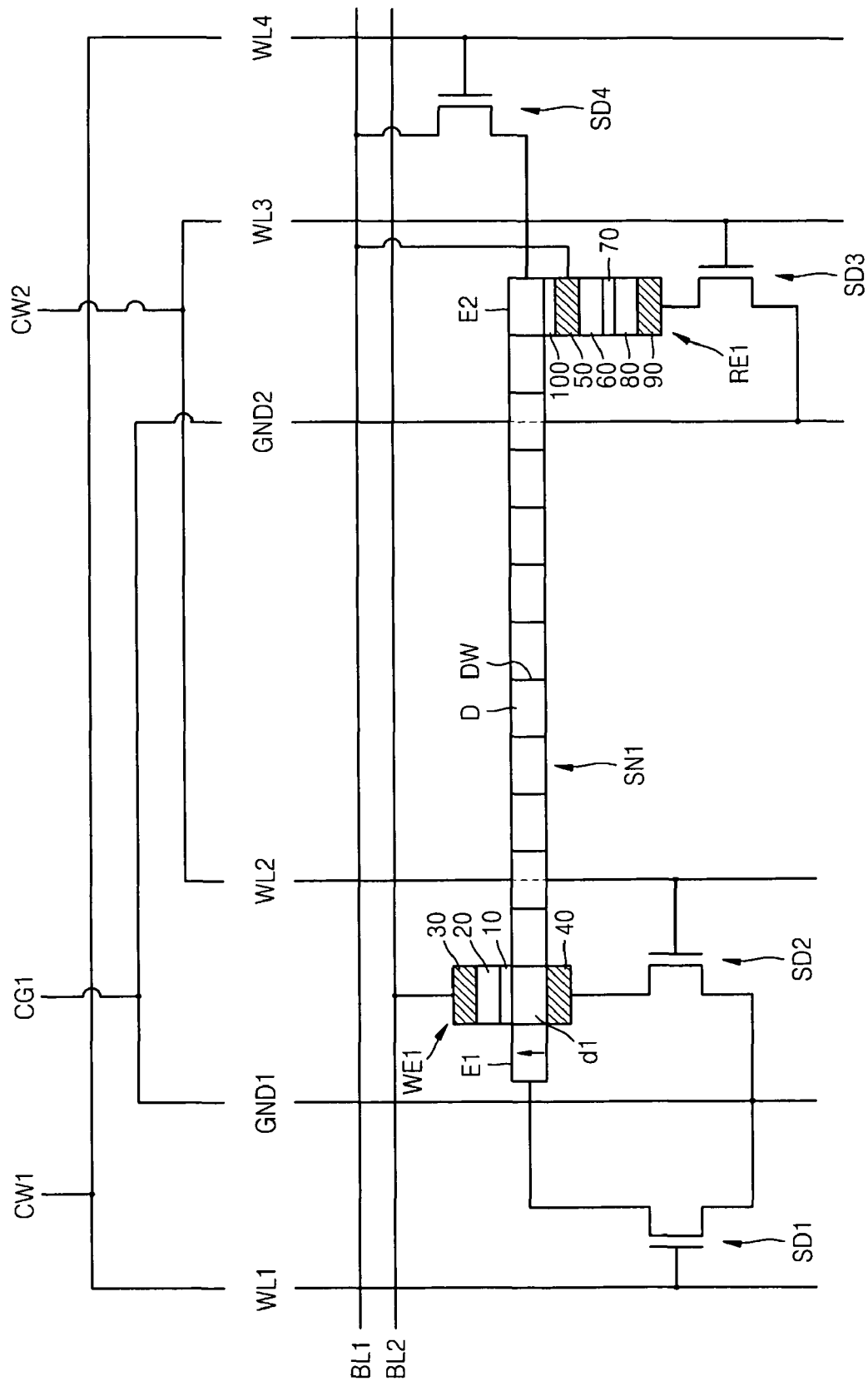

FIG. 6 illustrates an information storage device similar to the information storage device of FIG. 5 except that the information storage device of FIG. 6 further includes a second common interconnecting wire CW2 connecting the second word line WL2 and the third word line WL3. In this example, the second word line WL2 and the third word line WL3 may be connected to a common voltage source, and thus, the same signal may be applied to the second word line WL2 and the third word line WL3.

Figure 9:
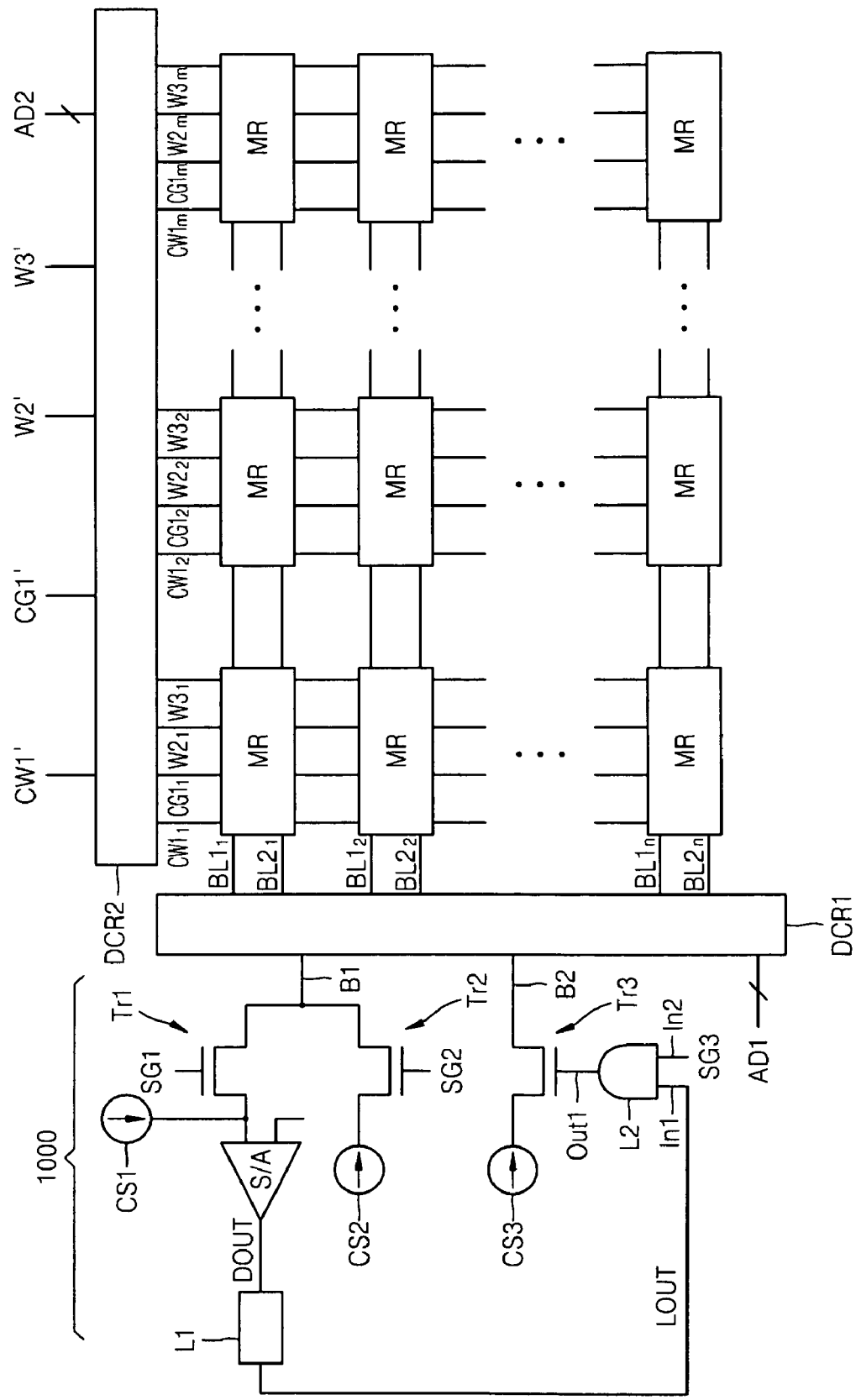
FIGS. 9 and 10 are circuit diagrams illustrating overall architectures of an information storage device using magnetic domain wall movement according to example embodiments.
Figure 10:
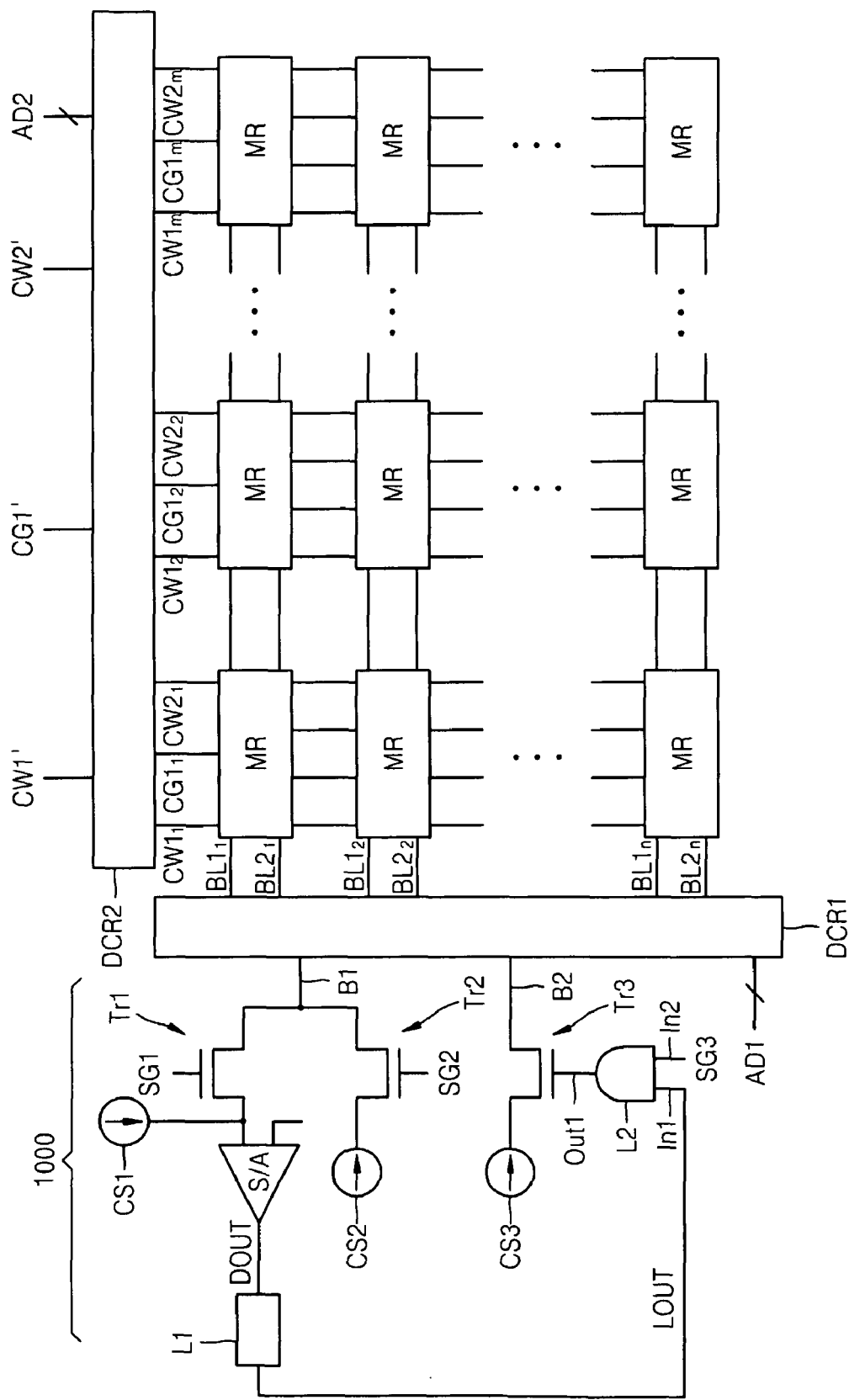

Although not shown in FIGS. 1 through 6, information storage devices according to example embodiments may include a magnetic domain wall moving unit electrically connected to the storage node SN1. The magnetic domain wall moving unit may be configured to move the magnetic domain walls. The magnetic domain wall moving unit may include a second current source SG2 and a second transistor Tr2 as illustrated in FIGS. 9 and 10. The second transistor Tr2 is an example of a switching device located between the second current source SG2 and the storage node SN1. Information storage devices according to example embodiments may also include a temporary storage unit electrically connected to the read element RE1. The temporary storage unit may be configured to temporarily store read information (data) from the read element RE1. Information storage devices may further include a write control unit electrically connected to the temporary storage unit and the write element WE1. The write control unit may control current supplied to the write element WE1. The temporary storage unit may correspond to a temporary storage unit L1 illustrated in FIGS. 9 and 10. The write control unit may include a third current source CS3, a third transistor Tr3 and a logic device L2 illustrated in FIGS. 9 and 10. The third transistor Tr3 is an example of a switching device disposed between the third current source CS3 and the write element WE1.

The example embodiments of information storage devices illustrated in FIGS. 1 through 6 may be a unit memory region. An information storage device according to another example embodiment may include a plurality of unit memory regions having a two-dimensional (2D) array structure, as shown in FIG. 7.

Figure 7:
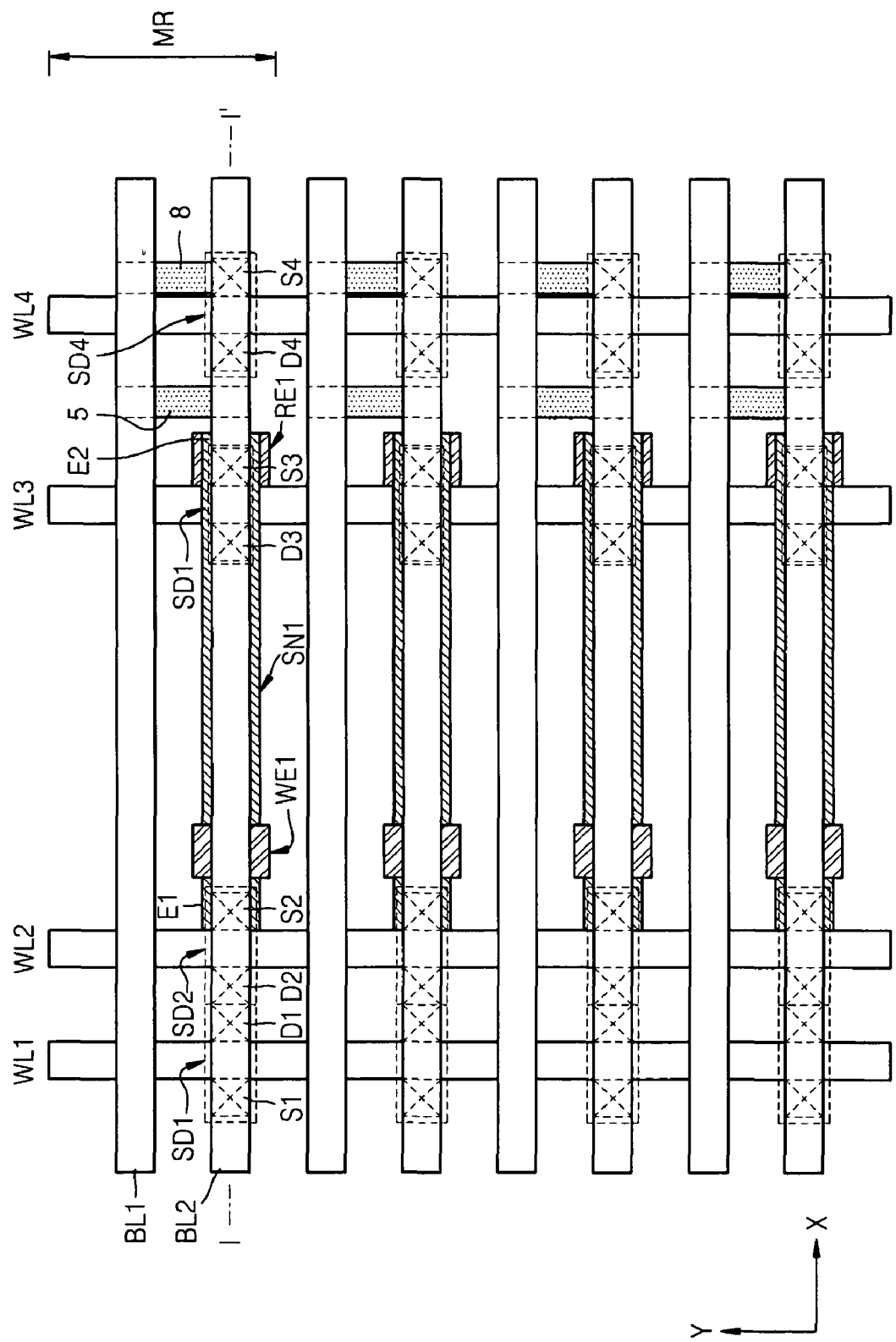
FIG. 7 is a layout diagram of an information storage device using magnetic domain wall movement according to an example embodiment.

FIG. 7 is a layout diagram of an information storage device according to another example embodiment.

Referring to FIG. 7, a plurality of unit memory regions MR are arranged in the direction of the Y-axis. Each of the unit memory regions MR may have the circuit structure illustrated, for example, in FIG. 4.

Figure 8:
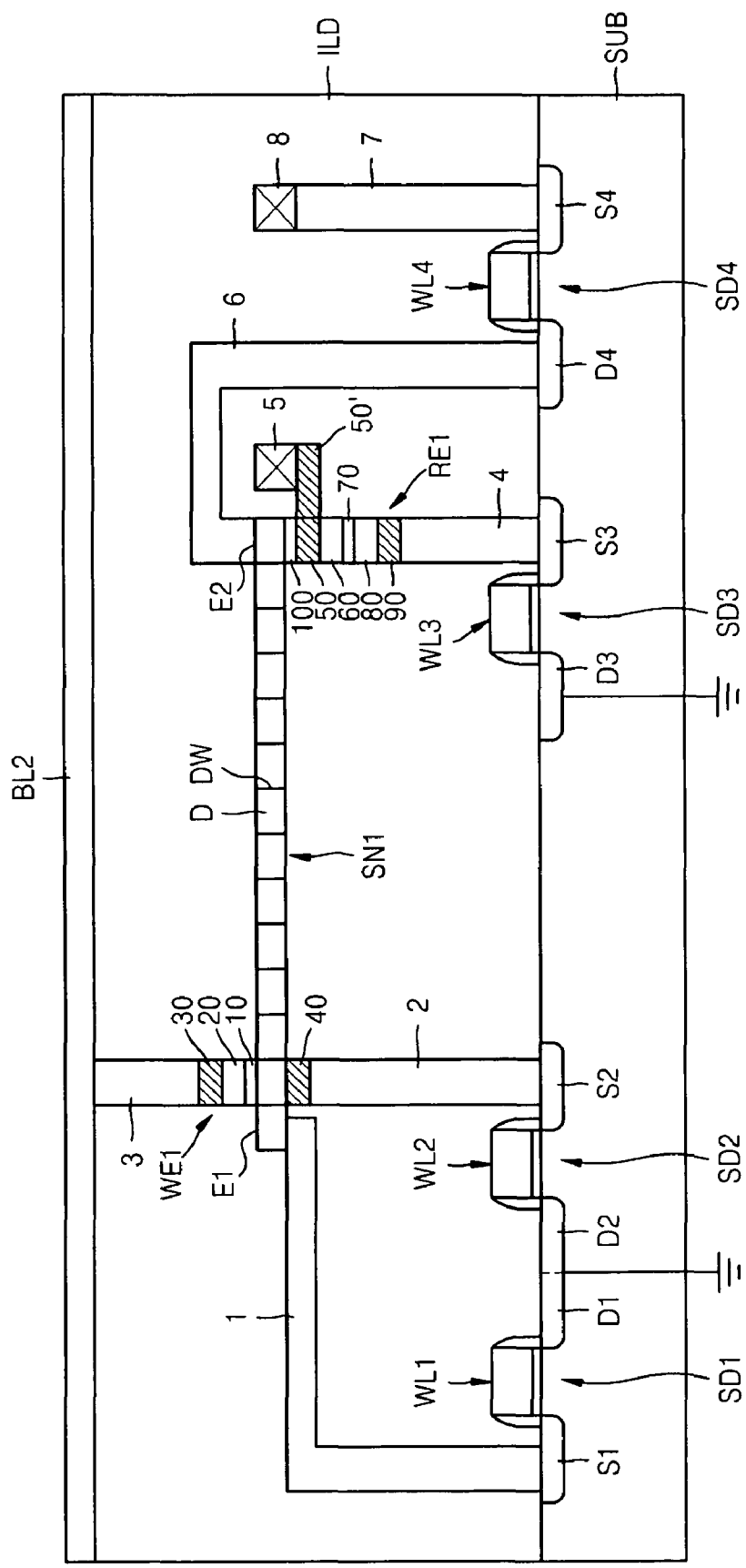
FIG. 8 is a cross-sectional view taken along the line I-I' of FIG. 7.

The structure of each of the unit memory regions MR will now be described in detail with reference to FIG. 7 and FIG. 8. FIG. 8 is a cross-sectional view taken along line I-I' of FIG. 7.

In FIG. 7, each of the unit memory regions MR includes first through fourth word lines WL1 through WL4 extending in the direction of the Y-axis, and first and second bit lines BL1 and BL2 intersecting the first through fourth word lines WL1 through WL4. A storage node SN1 may be formed under and in parallel with the second bit line BL2. A write element WE1 may be disposed next to a first end E1 of the storage node SN1 adjacent to the second word line WL2, and a read element RE1 may be disposed at a second end E2 of the storage node SN1. A first source S1 and a first drain D1 may be respectively disposed adjacent to the left and right sides of the first word line WL1 under the second bit line BL2. The first source S1, the first drain D1, and the first word line WL1 between the first source S1 and the first drain D1 may form a first switching device SD1.

The first source S1 may be connected to the first end E1 of the storage node SN1 and the first drain D1 may be grounded (as shown in FIG. 8). Referring to FIG. 8, reference numeral 1 denotes a first connecting conductor connecting the first source S1 with the first end E1 of the storage node SN1.

Referring back to FIG. 7, a second source S2 and a second drain D2 may be respectively disposed adjacent to the right and left sides of the second word line WL2 under the second bit line BL2. The second source S2, the second drain D2, and the second word line WL2 between the second source S2 and the second drain D2 may form a second switching device SD2. The second source S2 may be connected to the second electrode layer 40 (which may be referred to as a lower surface of the write element WE1), the second drain D2 may be grounded, and an upper surface (a first electrode layer 30) of the write element WE1 may be connected to the second bit line BL2 (as shown in FIG. 8). Referring to FIG. 8, reference numerals 2 and 3 respectively denote a second connecting conductor connecting the second source S2 with the second electrode layer 40, and a third connecting conductor connecting the first electrode layer 30 with the second bit line BL2.

Returning back to FIG. 7, a third source S3 and a third drain D3 may be respectively disposed adjacent to the right and left sides of the third word line WL3 under the second bit line BL2. The third source S3, the third drain D3, and the third word line WL3 between the third source S3 and the third drain D3 may form a third switching device SD3. The third source S3 may be connected to a fourth electrode layer 90 of the read element RE1, and the third drain D3 may be grounded (as shown in FIG. 8). In FIG. 8, reference numeral 4 denotes a fourth connecting conductor connecting the third source S3 and the fourth electrode layer 90. A third electrode layer 50 of the read element RE1 may be connected to the first bit line BL1.

As illustrated in FIG. 8, in order to connect the third electrode layer 50 with the first bit line BL1, an extended electrode layer 50' may extend from one side of the third electrode layer 50 and a fifth connecting conductor 5 may be arranged on the extended electrode layer 50'. The extended electrode layer 50' may be integrally formed with the third electrode layer 50, and the fifth connecting conductor 5 may extend from the bottom of the second bit line BL2 to the first bit line BL1 as illustrated in FIG. 7.

Although not illustrated in FIG. 7, another connecting conductor may be disposed at one end of the fifth connecting conductor 5 under the first bit line BL1 to be connected to the first bit line BL1. A fourth source S4 and a fourth drain D4 may be respectively disposed adjacent to the right and left sides of the fourth word line WL4 under the second bit line BL2. The fourth source S4, the fourth drain D4, and the fourth word line WL4 between the fourth source S4 and the fourth drain D4 may form a fourth switching device SD4. The fourth drain D4 may be connected to the second end E2 of the storage node SN1 (as shown in FIG. 8). In FIG. 8, reference numeral 6 denotes a sixth connecting conductor connecting the fourth drain D4 and the second end E2 of the storage node SN1.

The fourth source S4 may be connected to the first bit line BL1. Referring to FIG. 8, in order to connect the fourth source S4 to the first bit line BL1, a seventh connecting conductor 7 may be disposed on the fourth source S4 and an eighth connecting conductor 8 may be disposed on the seventh connecting conductor 7. The eighth connecting conductor 8 may extend from the bottom of the second bit line BL2 to the first bit line BL1 as illustrated in FIG. 7. Although not illustrated in FIG. 7, another connecting conductor may be disposed on one end of the eighth connecting conductor 8 under the first bit line BL1 to be connected to the first bit line BL1.

In FIGS. 7 and 8, the first and second ground lines GND1 and GND2 illustrated in FIGS. 1 through 4 are not illustrated since the first through third drains D1 through D3 may actually be grounded without additional ground lines (the first and second ground lines GND1 and GND2) crossing a cell region. Accordingly, in the cell region, the first through third drains D1 through D3 may be formed in a relatively long line and a grounding contact layer may be formed at an end of each of the drains. In FIG. 8, reference numerals SUB and ILD denote a substrate and an insulating material layer, respectively.

FIG. 9 illustrates an example, overall architecture of an information storage device according to an example embodiment.

Referring to FIG. 9, a plurality of unit memory regions MR may be arranged in n rows and m columns. Although the unit memory regions MR are illustrated in a simplified form in FIG. 9, their detailed structures may be the same or substantially the same as the example embodiment illustrated in FIG. 5. Reference numeral BL1 denotes a first bit line commonly connected to the unit memory regions MR present in the $i^{th}$ row, and reference numeral $BL2_i$ denotes a second bit line commonly connected to the unit memory regions MR present in the $i^{th}$ row (i is a natural number satisfying $1 \leq i \leq n$). Reference numerals $CW1_j$, $W2_j$ and $W3_j$ denote a first common interconnecting wire, a second interconnecting wire, and a third interconnecting wire, respectively, each of which is commonly connected to the unit memory regions MR present in the $j^{th}$ row. Reference numeral $CG1_j$ denotes a first common ground line commonly connected to the unit memory regions MR present in the $j^{th}$ row (j is a natural number satisfying $1 \leq j \leq m$). The first common interconnecting wire $CW1_j$, the second interconnecting wire $W2_j$, the third interconnecting wire $W3_j$, and the first common ground line $CG1_j$ may correspond to the first common interconnecting wire CW1, the second interconnecting wire W2, the third interconnecting wire W3 and the first common ground line CG1 illustrated in FIG. 5.

A column decoder DCR1 may be commonly connected to first and second groups of bit lines $BL1_1$ through $BL1_n$ and $BL2_1$ through $BL2_n$. A row decoder DCR2 may be commonly connected to first common interconnecting wires $CW1_1$ through $CW1_m$, second interconnecting wires $W2_1$ through $W2_m$, third interconnecting wires $W3_1$ through $W3_m$, and first common ground lines $CG1_1$ through $CG1_m$. One unit memory region MR may be selected from among the unit memory regions MR by the column decoder DCR1 and the row decoder DCR2. The column decoder DCR1 and the row decoder DCR2 may include a selection logic device having a multiplexer (MUX)/de-multiplexer (DMUX) structure. Because such a selection logic device structure is well-known in the art, a detailed description of the column decoder DCR1 and the row decoder DCR2 is omitted.

A peripheral circuit 1000 may be disposed adjacent to a side of the column decoder DCR1 and connected to the column decoder DCR1. The peripheral circuit 1000 may include a sense circuit S/A connected to the column decoder DCR1. The sense circuit S/A may be a sense amplifier for amplifying an information signal read from one of the unit memory regions MR. The sense circuit S/A may include two input terminals, one of which may be electrically connected to the column decoder DCR1 and the other of which may be connected to a reference resistor (not shown). A first current source CS1 may be connected between the column decoder DCR1 and the sense circuit S/A. A first transistor Tr1 may be arranged between the first current source CS1 and the column decoder DCR1. The first current source CS1, the sense circuit S/A, and the first transistor Tr1 may form a sense unit. The sense unit may be electrically connected to the read element RE1 illustrated in FIGS. 1 through 6. The first transistor Tr1 may be an example of a switching device arranged between the first current source CS1 and the read element RE1.

A temporary storage unit L1 may be connected to an output terminal of the sense circuit S/A to temporarily store information. For example, the temporary storage unit L1 may be a latch device. A latch device is well known in the art, and thus, a detailed description thereof is omitted. A signal output from the sense circuit S/A (e.g., a signal corresponding to information read from one of the unit memory regions MR) may be temporarily stored in the temporary storage unit L1.

A second current source CS2 may be connected to the column decoder DCR1 via a second transistor Tr2 arranged between the second current source CS2 and the column decoder DCR1. The first transistor Tr1 and the second transistor Tr2 may be connected to the column decoder DCR1 via a first input line B1, which may be a common interconnecting wire. A third current source CS3 may be connected to the column decoder DCR1 via a third transistor Tr3 arranged between the third current source CS3 and the column decoder DCR1. An interconnecting wire connecting the third transistor Tr3 to the column decoder DCR1 is referred to as a second input line B2. A logic device L2 including first and second input terminals In1 and In2 and an output terminal Out1 may be connected to the gate of the third transistor Tr3. In one example, the logic device L2 may be an AND logic device, but example embodiments are not limited thereto. The logic device L2 may be another type of logic device. The output terminal Out1 of the logic device L2 may be connected to the gate of the third transistor Tr3, and the first input terminal In1 of the logic device L2 may be connected to the temporary storage unit L1. Whether to turn the third transistor Tr3 on or off may be determined according to signals supplied to the first and second input terminals In1 and In2 of the logic device L2.

First through third external interconnecting wires CW1', W2', and W3' and a first external ground line CG1' may be connected to the row decoder DCR2. The first through third external interconnecting wires CW1', W2', and W3' may be connected to the first common interconnecting wire $CW1_j$, the second interconnecting wire $W2_j$, and the third interconnecting wire $W3_j$, respectively. The first external ground line CG1' may be connected to the first common ground line $CG1_j$. First through third voltage sources (not shown) may apply first and third voltage signals to the first through third external interconnecting wires CW1', W2', and W3', respectively.

A column address line AD1 and a row address line AD2 may be connected to the column decoder DCR1 and the row decoder DCR2, respectively. The logic operations of the column decoder DCR1 and the row decoder DCR2 may be respectively controlled in response to a signal from the column address line AD1 and a signal from the row address line AD2, thereby selecting one of the unit memory regions MR on which to perform an operation. After selecting one of the unit memory regions MR, information may be written to or read from the selected unit memory region MR by using the first through third current sources CS1 through CS3, the first through third transistors Tr1 through Tr3, and the first through third voltage sources. A signal supplied to the column decoder DCR1 via the first input line B1 may be supplied to the first bit line $BL1_i$ of the selected unit memory region MR, and a signal supplied to the column decoder DCR1 via the second input line B2 may be supplied to the second bit line $BL2_i$ of the selected unit memory region MR. Similarly, signals supplied to the row decoder DCR2 via the first through third external interconnecting wires CW1', W2', and W3' may be respectively supplied to the first common interconnecting wire $CW1_j$, the second interconnecting wire $W2_j$, and the third interconnecting wire $W3_j$ of the selected unit memory region MR. The first external ground line CG1' may be connected to the first common ground line $CG1_j$ of the selected unit memory region MR via the row decoder DCR2.

Still referring to FIG. 9, SG1 denotes a first input signal supplied to the first transistor Tr1, SG2 denotes a second input signal supplied to the second transistor Tr2, and SG3 denotes a third input signal supplied to the second input terminal In2 of the logic device L2. Also, DOUT denotes a first output signal output from the sense circuit S/A to the temporary storage unit L1, and LOUT denotes a second output signal output from the temporary storage unit L1 to the logic device L2.

The second interconnecting wire $W2_j$ and the third interconnecting wire $W3_j$ illustrated in FIG. 9 may be integrated as a common interconnecting wire. Similarly, the second external interconnecting wire W2' and the third external interconnecting wire W3' may be integrated as a common interconnecting wire, as illustrated in FIG. 10.

FIG. 10 is a circuit diagram illustrating an example, overall architecture of an information storage device according to another example embodiment.

Referring to FIG. 10, a second common interconnecting wire $CW2_j$ is a combination of the second interconnecting wire $W2_j$ and the third interconnecting wire $W3_j$ illustrated in FIG. 9. A fourth external interconnecting wire CW2' is a combination of the second external interconnecting wire W2' and the third external interconnecting wire W3' illustrated in FIG. 9. Each of the unit memory regions MR of FIG. 10 may have the circuit structure illustrated in FIG. 6.

FIGS. 11A through 11D are diagrams for illustrating a method of recording information in the information storage device, according to an example embodiment. This example embodiment is described with regard to the information storage device illustrated in FIG. 4. In FIGS. 11A through 11D, voltages applied to first through fourth word lines WL1 through WL4 are respectively referred to as first through fourth voltages V1 through V4. The same voltages will also be described with regard to FIGS. 12A through 12E and 15A through 15E.

In FIGS. 11A through 11D, the direction of the Z-axis is the same as the direction of the Z-axis of FIG. 1, which will also be applied to FIGS. 12A through 12E and FIGS. 15A through 15E.

Figure 11A:
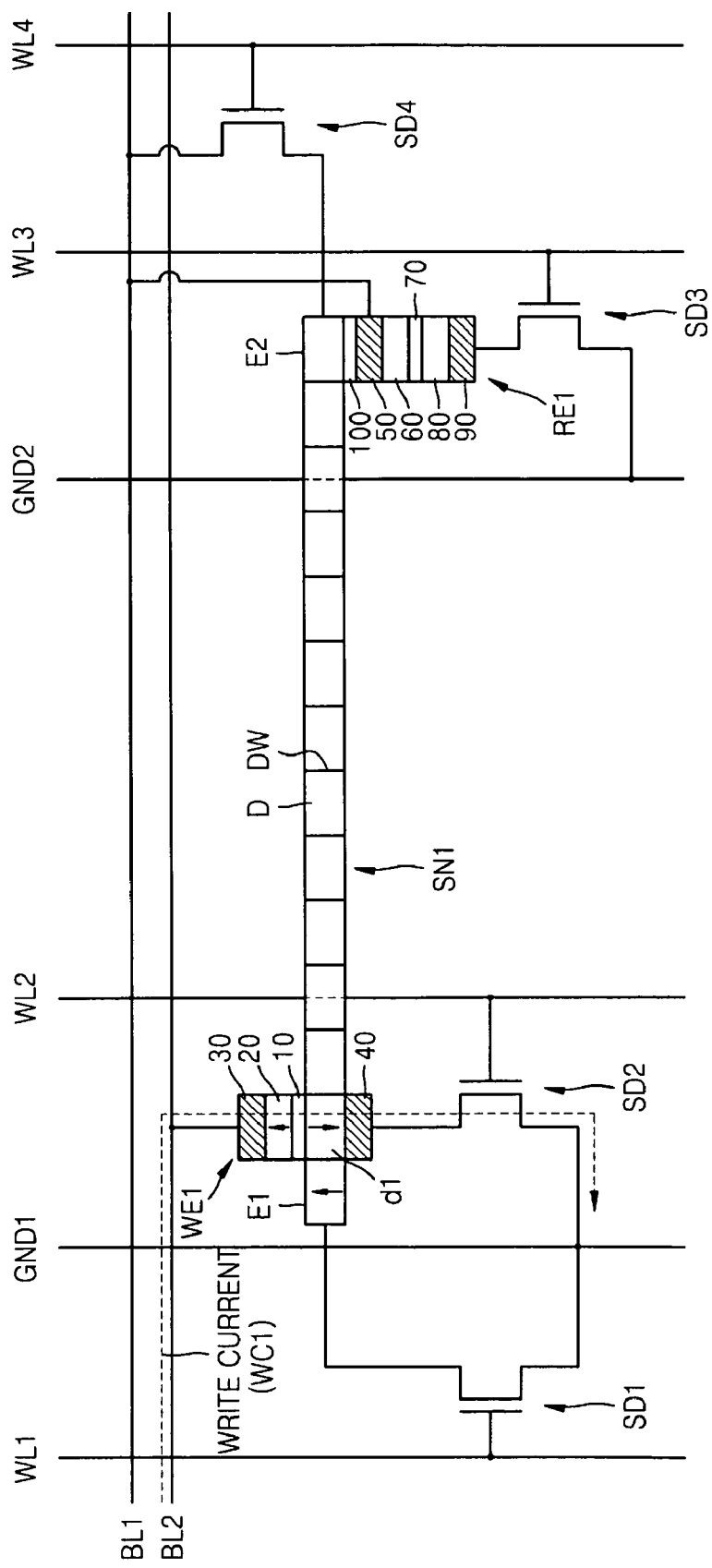
FIGS. 11A through 11D are diagrams illustrating a method of recording information in the information storage device according to an example embodiment.

Referring to FIG. 11A, to write given, desired or predetermined information to a first region d1 of a storage node SN1, a write current WC1 may be supplied to a second switching device SD2 from a second bit line BL2 via a write element WE1 while turning on a second switching device SD2 by applying the second voltage V2 to the second word line WL2. The first region d1 may be magnetized in a direction opposite to the direction of the Z-axis by the write current WC1. An arrow marked on the first region d1 indicates the direction of magnetization of the first region d1. In this example, the first region d1 magnetized in the direction opposite to the direction of the Z-axis indicates that the given, desired or predetermined information (e.g., a data value 1) is written to the first region d1. Thus, FIG. 11A may be considered as illustrating a method of recording a data value 1. A first end E1 of the storage node SN1 may be magnetized in the direction of the Z-axis, and thus, the first end E1 of the storage node SN1 may store a data value 0.

Figure 11B:
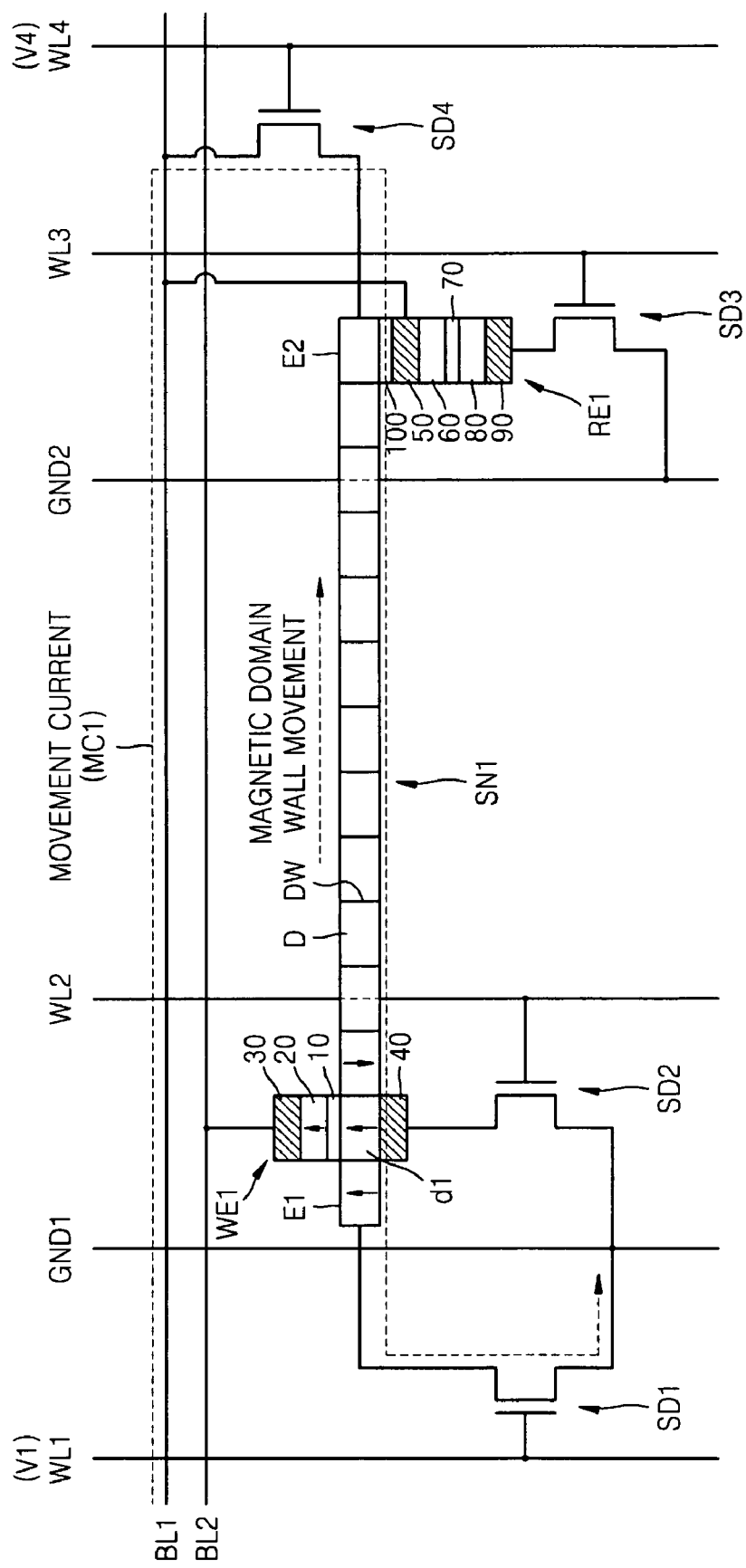

Referring to FIG. 11B, a movement current MC1 may be supplied to a first switching device SD1 from a first bit line BL1 via a fourth switching device SD4 and the storage node SN1 while turning on the first and fourth switching devices SD1 and SD4 by respectively applying the first and fourth voltages V1 and V4 to first and fourth word lines WL1 and WL4. In this example, the first and fourth word lines WL1 and WL4 may be connected via a common interconnecting wire and the same or substantially the same voltage signal may be supplied to the first and fourth word lines WL1 and WL4. The movement current MC1 may be a pulse current, and magnetic domains and magnetic domain walls may move by 1 bit within the storage node SN1 in response to the movement current MC1. Because magnetic domains and magnetic domain walls move in a direction of movement of electrons, the direction in which the magnetic domains and the magnetic domain walls move is opposite to the direction of the movement current MC1. For example, the magnetic domains and the magnetic domain walls may move by 1 bit toward a second end E2 of the storage node SN1 in response to the movement current MC1.

Referring to FIG. 11B, the data value 1 written to the first region d1 as described above with reference to FIG. 11A may move (e.g., extend or shift) to a magnetic domain region D to the right side of the first region d1. The magnetic domain at the first end E1 of the storage node SN1 may move to the first region d1. For example, if the first end E1 of the storage node SN1 has a magnetic domain magnetized in a given, desired or predetermined direction, when current is supplied from the second end E2 to the first end E1, the magnetic domain at the first end E1 may extend towards the second end E2 in response to the current. Thus, the first region d1 may be magnetized in the direction of the Z-axis, which indicates that the data value 0 is written to the first region d1. In this example, the data value 0 may be written to the first region d1 by applying only the movement current MC1 without using the write current WC1. Thus, FIG. 11B illustrates a method of recording a data value 0. However, referring to FIG. 11B, if the data value 1 is to be written to the first region d1 after moving the magnetic domains and the magnetic domain walls by 1 bit, the direction of magnetization of the first region d1 may be reversed by using the write current WC1 discussed above with regard to FIG. 11A.

Figure 11C:
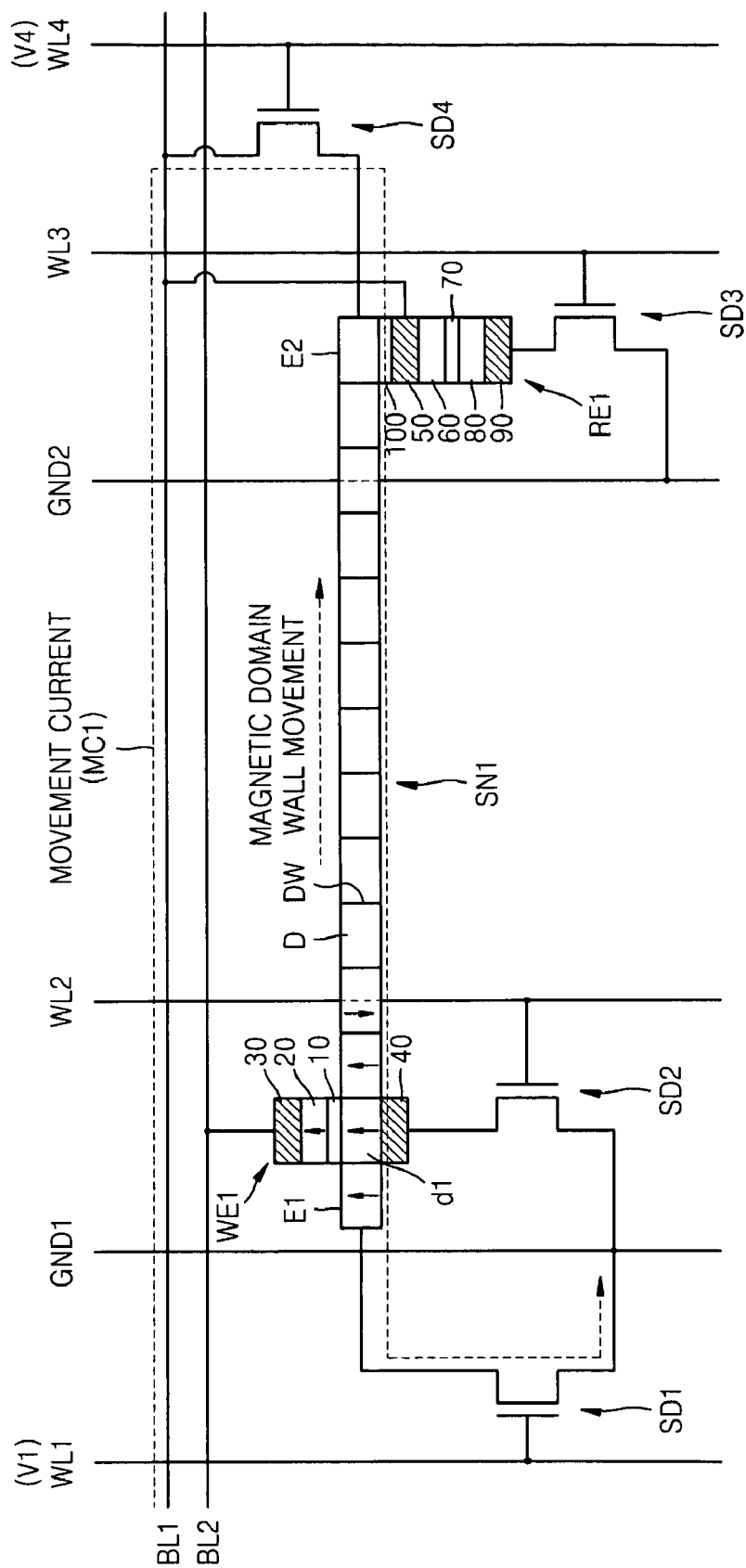

Referring to FIG. 11C, the magnetic domains and the magnetic domain walls may be moved within the storage node SN1 by 1 bit toward the second end E2 of the storage node SN1, in a similar manner to FIG. 11B. In this example, the magnetic domain at the first end E1 of the storage node SN1 may again extend to the first region d1.

Figure 11D:
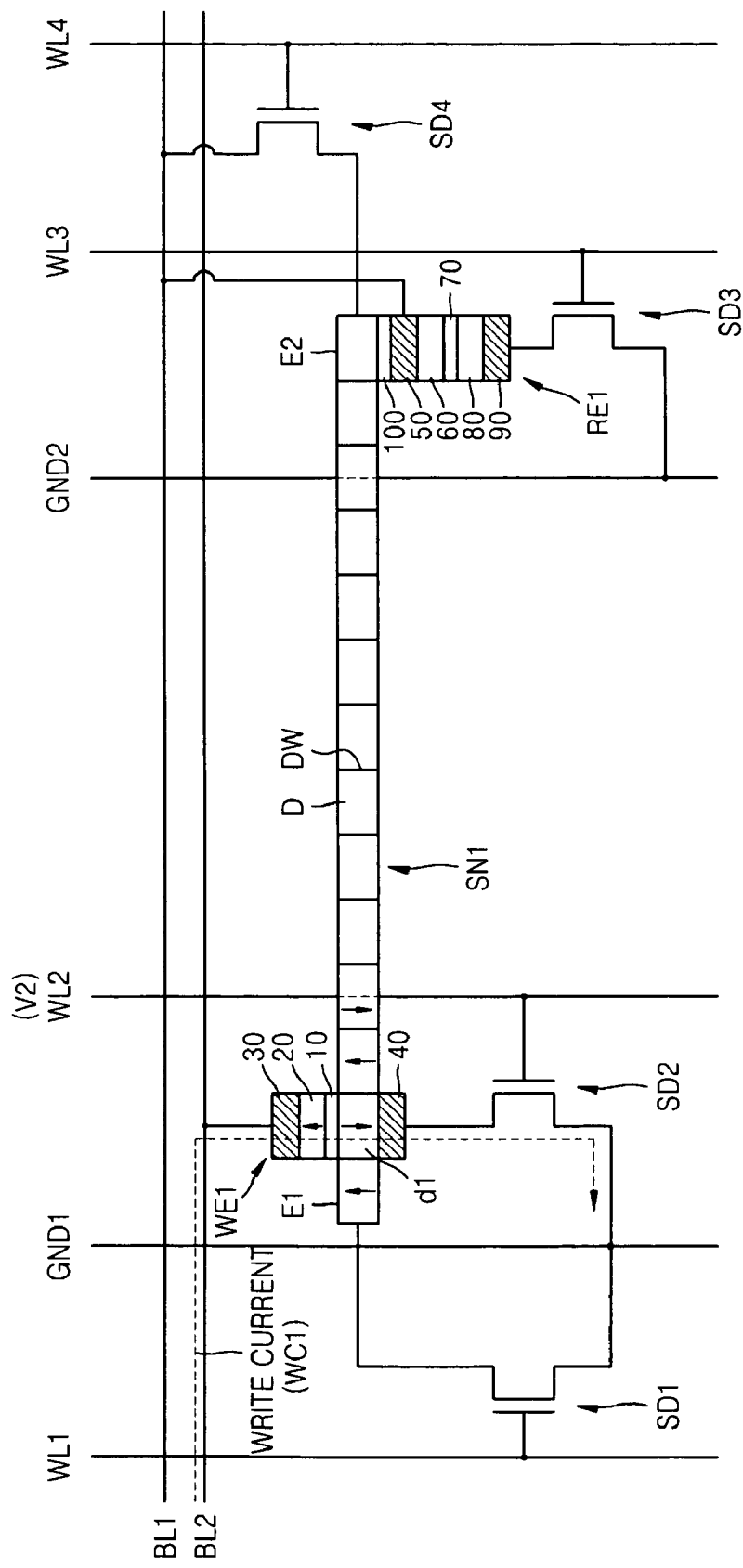

Referring to FIG. 11D, the direction of magnetization of the first region d1 may be reversed by applying the write current WC1 to the first region d1 in a similar or substantially similar manner to FIG. 11A, thereby writing a data value 1 to the first region d1. According to example embodiments, such reversing of the direction of magnetization of the first region d1 by using the write current WC1 may be selectively performed according to the data value to be written.

As described above, a data value 1 or 0 may be written to the first region d1 by moving the magnetic domains and the magnetic domain walls within the storage node SN1 on a bit-by-bit basis. Such a write operation may be performed until a data value initially written to the first region d1 moves to the second end E2 of the storage node SN1.

In the above-described example embodiment, the write current WC1 may flow in one direction. For example, the write current WC1 flows from the second bit line BL2 to the second switching device SD2 via the write element WE1 and is used to write data to the first region d1, but a different write current flowing in the opposite direction need not be used. The first region d1 may be magnetized in the direction of the Z-axis by the different write current. However, the first region d1 may be automatically magnetized in the direction of the Z-axis by moving the magnetic domain at the first end E1 of the storage node SN1 to the first region d1, and thus, the different write current need not be used. The movement current MC1 applied to move the magnetic domains and the magnetic domain walls may also flow in only one direction. Because the write current WC1 and the movement current MC1 may be fixed to flow in respective directions, recording may be performed in a simplified manner and the structure of the information storage device may also be simplified. In addition, the first, second and fourth switching devices SD1, SD2 and SD4 may have a structure other than a transistor structure (e.g., a diode structure).

In the above example embodiment, the write element WE1 may be disposed at the first region d1, but example embodiments are not limited thereto. For example, the write element WE1 may be disposed at the first end E1 of the storage node SN1. In this case, the magnetization direction of the first end E1 may be determined by two write currents flowing in different directions.

FIGS. 12A through 12E are diagrams illustrating a method of reproducing information stored in the information storage device, according to an example embodiment. The information storage device used in this example embodiment has the same structure as the information storage device illustrated in FIG. 4, except that a plurality of magnetic domain regions D of a storage node SN1 are magnetized in given directions, respectively. In other words, given information is written to the magnetic domain regions D. In at least this example embodiment, first and fourth word lines WL1 and WL4 may be connected via a common interconnecting wire and thus the same signal may be supplied thereto, but second and third word lines WL2 and WL3 may not be electrically connected with each other. The information storage device illustrated in FIGS. 12A through 12E may be a part of the information storage device of FIG. 9. FIG. 9 may also be referred to as needed when describing FIGS. 12A through 12E.

Figure 12A:
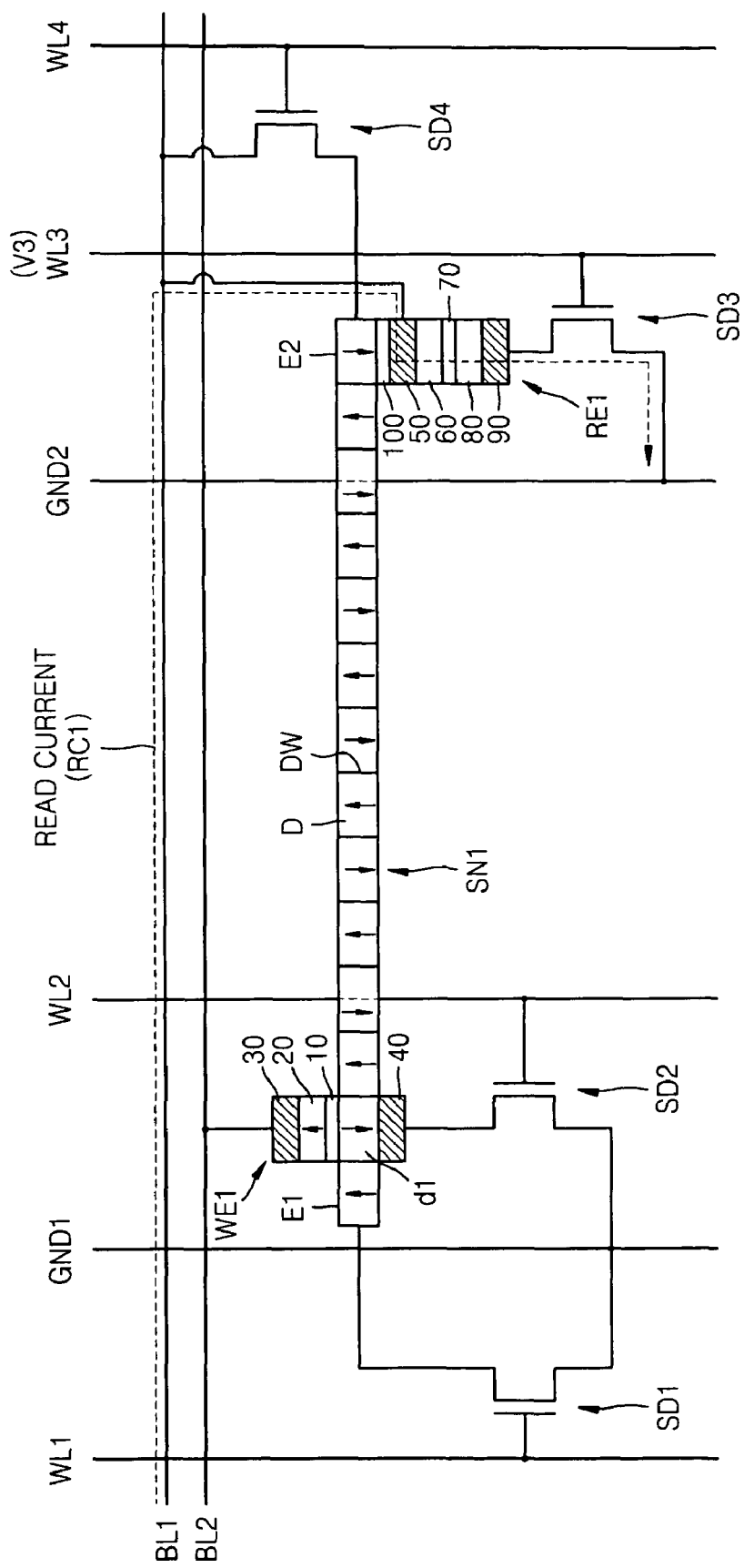
FIGS. 12A through 12E are diagrams illustrating a method of reproducing information stored in the information storage device according to an example embodiment.

Referring to FIG. 12A, a third switching device SD3 may be turned on by applying a third voltage V3 to a third word line WL3, and a read current RC1 may be supplied from a first bit line BL1 to the third switching device SD3 via a read element RE1. The intensity of the read current RC1 depends on the direction of magnetization of a second end E2 of the storage node SN1. Thus, information may be read information from the second end E2 of the storage node SN1 by supplying the read current RC1. Such read current RC1 may be supplied by operating the first transistor Tr1 and the first current source CS1 of FIG. 9. In this case, a signal of the read information may be amplified by the sense circuit S/A shown in FIG. 9 and the amplified signal may be stored in the temporary storage unit L1. As illustrated in FIG. 12A, if the information written to the second end E2 of the storage node SN1 is a data value 1, the signal stored in the temporary storage unit L1 of FIG. 9 may also correspond to the data value 1. The signal stored in the temporary storage unit L1 may be supplied to the logic device L2 and may be retained in the logic device L2 until a next reproduction signal is supplied from the sense circuit S/A to the temporary storage unit L1.

Figure 12B:
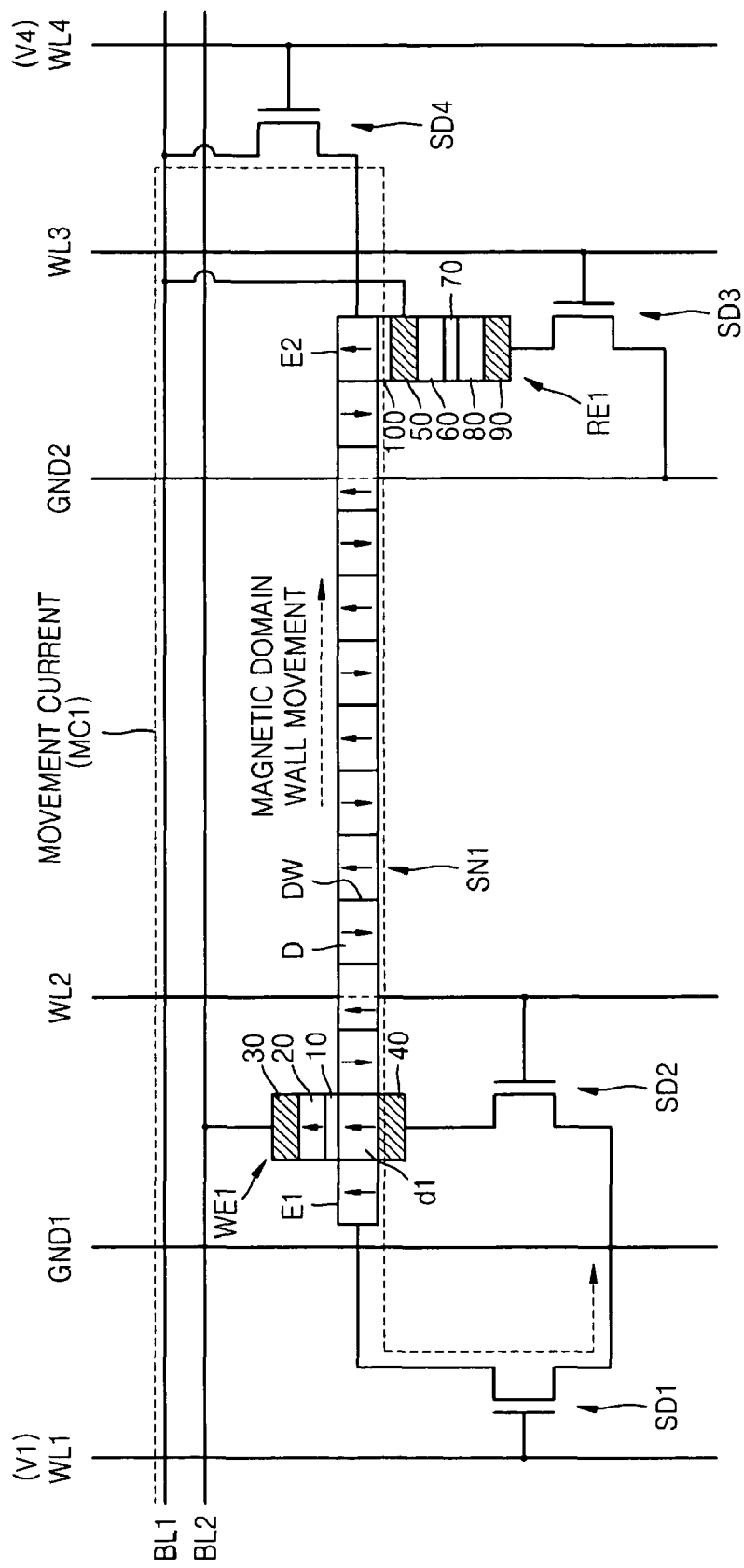

Referring to FIG. 12B, the magnetic domains and magnetic domain walls may be moved by 1 bit within the storage node SN1 toward the second end E2 of the storage node SN1 by supplying a movement current MC1 in a manner similar or substantially similar to the manner described above with regard to FIG. 11B. In this case, the magnetic domain at a first end E1 of the storage node SN1 may extend to a first region d1 of the storage node SN1.

Figure 12C:
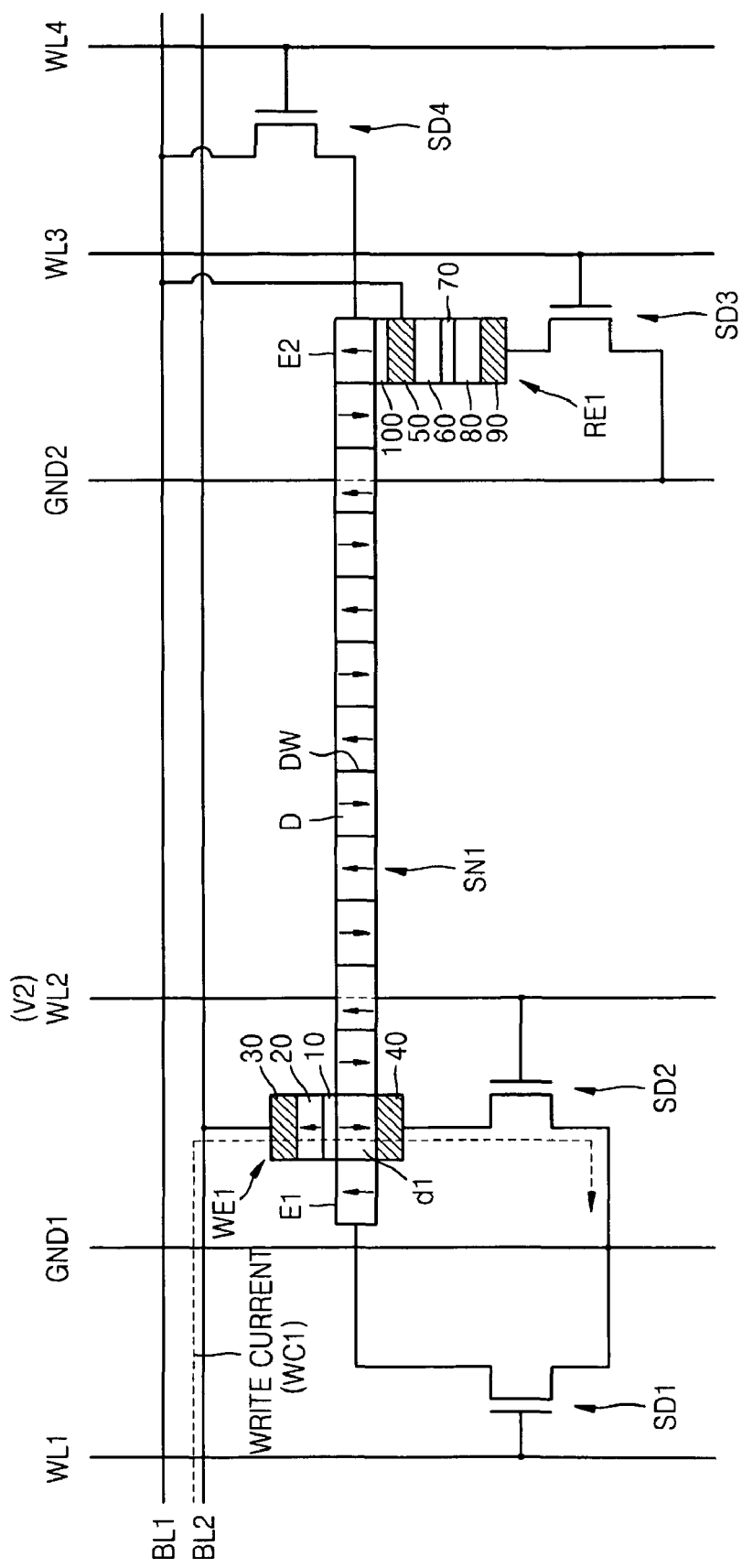

Referring to FIG. 12C, the information read in FIG. 12A may be written to the first region d1. If the read information is the data value 1, a write current WC1 may be supplied as illustrated in FIG. 12C to write the data value 1 to the first region d1. The write current WC1 may be supplied in a manner similar or substantially similar to the manner described above with regard to FIG. 11A. If the read information is a data value 0, the write current WC1 need not be supplied because the data value 0 has already been written to the first region d1 due to the movement of the magnetic domains and the magnetic domain walls, as illustrated in FIG. 12B. Whether to supply the write current WC1 may be determined by the type of information read and stored in the temporary storage unit L1 as illustrated in FIG. 12A. If the information stored in the temporary storage unit L1 of FIG. 9 is the data value 1, the write current WC1 may be supplied by turning on the third transistor Tr3 by the logic device L2 connected to the temporary storage unit L1 when a given, desired or predetermined signal (e.g., the third input signal SG3) is supplied to the logic device L2 via the second input terminal In2. However, if the information stored in the temporary storage unit L1 is the data value 0, even when the given signal is supplied to the logic device L2 via the second input terminal In2, the write current WC1 may not be supplied because the third transistor Tr3 is not turned on. Whether to supply the write current WC1 may be determined when a given, desired or predetermined signal (e.g., the third input signal SG3) is supplied to the logic device L2 via the second input terminal In2.

Figure 12D:
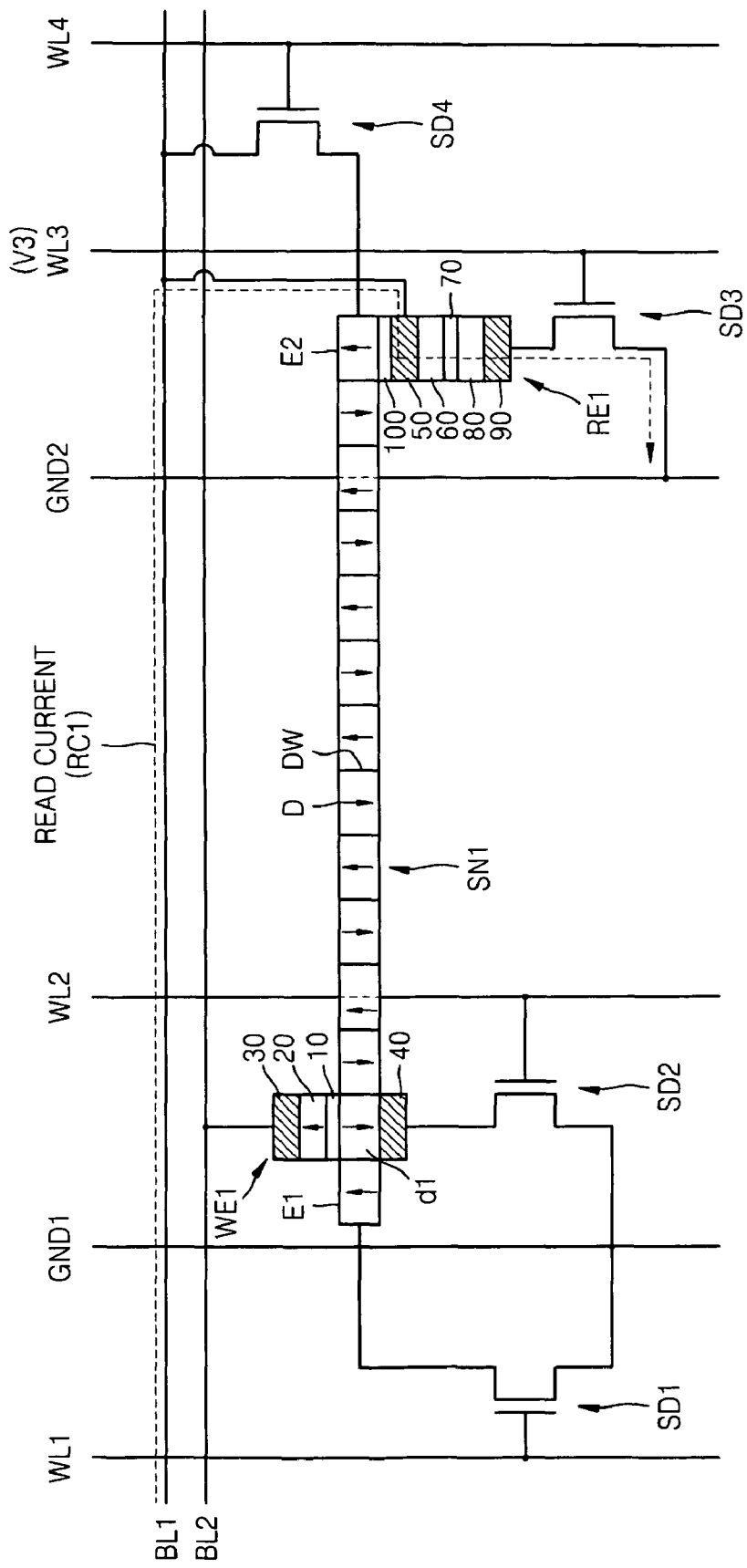

Referring to FIG. 12D, the information stored in the magnetic domain at the second end E2 of the storage node SN1 may be read in a manner similar or substantially similar to that described with reference to FIG. 12A. The read information (e.g., data value 0) may be temporarily stored in the temporary storage unit L1 of FIG. 9.

Figure 12E:
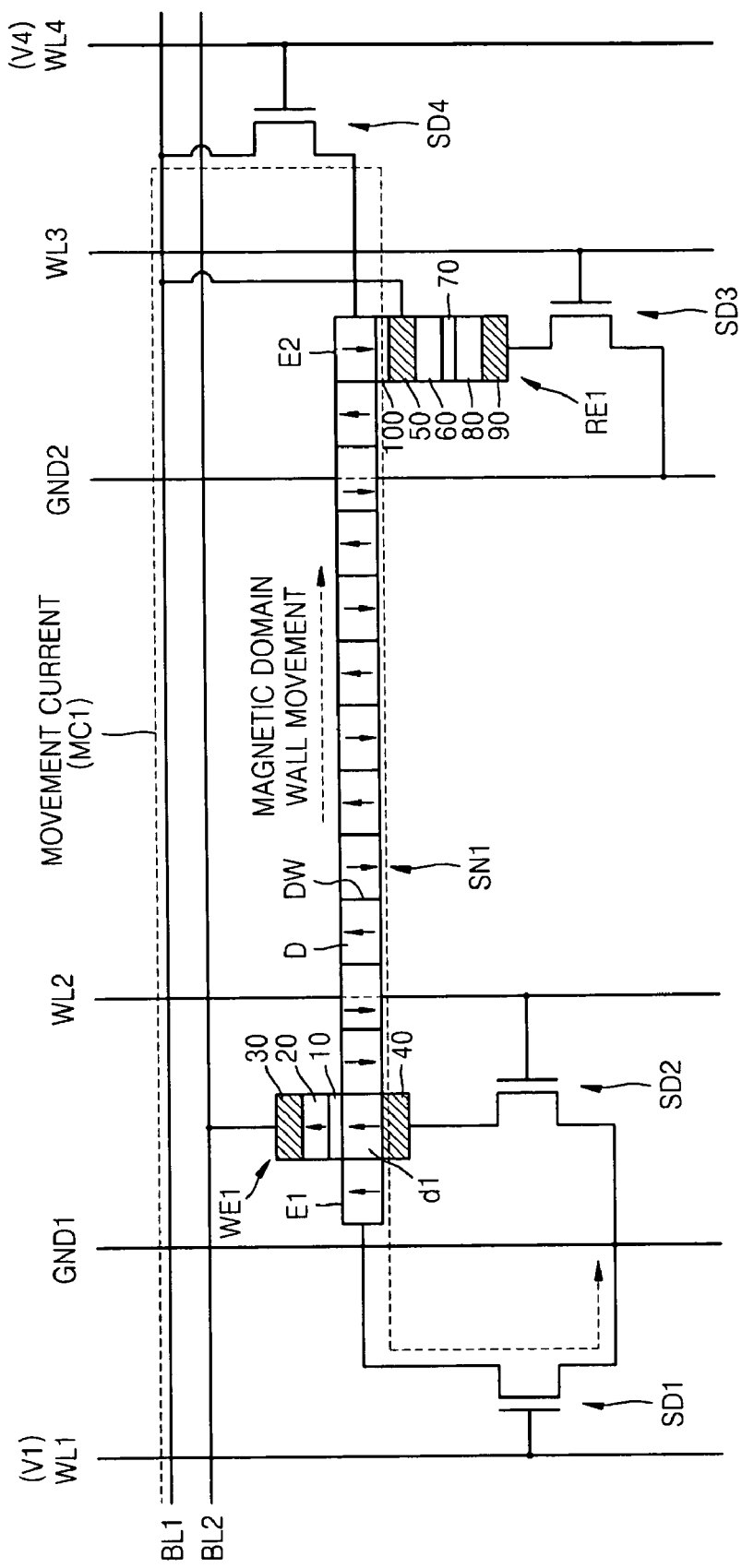

Referring to FIG. 12E, the magnetic domains and the magnetic domain walls may be moved by 1 bit within the storage node SN1 toward the second end E2 of the storage node SN1 by supplying the movement current MC1, in a manner similar or substantially similar to that described with reference to FIG. 12B. In this case, the magnetic domain at the first end E1 of the storage node SN1 may extend to the first region d1. The magnetic domain in the first region d1 may contain the data value 0, and the direction of magnetization of the first region d1 need not be reversed using the write current WC1 because the information read in FIG. 12D was the data value 0. In this case, the write current WC1 need not be supplied. For example, even if the third input signal SG3 is supplied to the logic device L2 via the second input terminal In2, the write current WC1 need not be supplied according to a logic operation of the logic device L2.

Although not shown in the drawings, the magnetic domains and the magnetic domain walls may be moved by 1 bit within the storage node SN1 toward the second end E2 by supplying the movement current MC1, in a manner similar or substantially similar to that described with reference to FIG. 12B. Information may be read again from the magnetic domain at the second end E2.

Accordingly, in this example embodiment, while moving the magnetic domains and the magnetic domain walls within the storage node SN1 by 1 bit towards the second end E2, information may be reproduced from the second end E2 of the storage node SN1. The reproduced information may be transferred to the first region d1. As described above, the write current WC1 may or may not be used during the transferring of the reproduced information to the first region d1. Reproducing the information, moving the magnetic domains, and selective recording of the reproduced information using the write current WC1 may be performed repeatedly until the first information reproduced and transferred to the first region d1 is present again in the second end E2 of the storage node SN1. Therefore, it may be possible to completely reproduce information from the entire storage node SN1 except for the first end E1 thereof. The storage node SN1 may be returned back to its original state (e.g., before the reproducing) when the reproducing is completed. Thus, the entire storage node SN1 except for the first end E1 thereof may serve as an effective storage region, and an information storage device having relatively high and/or improved recording density may be realized.

Figure 13:
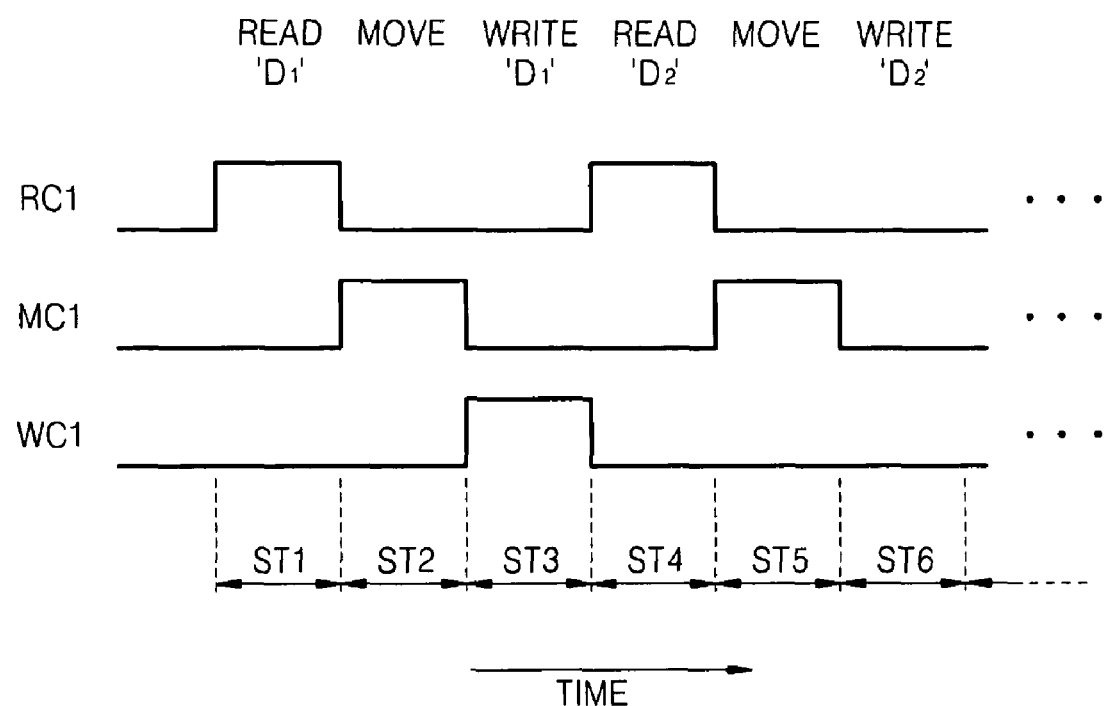
FIG. 13 is a waveform diagram of a read current, a movement current, and a write current usable in reproducing (reading) information stored in information storage devices according to example embodiments.

FIG. 13 is a waveform diagram of a read current RC1, a movement current MC1, and a write current WC1, which may be used in reproducing information stored in an information storage device, according to an example embodiment.

In FIG. 13, first through fifth operations ST1 through ST5 may correspond to the operations illustrated in FIGS. 12A through 12E, respectively. The read current RC1 may be supplied in the first operation ST1, the movement current MC1 may be supplied in the second operation ST2, and the write current WC1 may be supplied in the third operation ST3. The read current RC1 may be supplied again in the fourth operation ST4, the movement current MC1 may be supplied in the fifth operation ST5, and the write current WC1 may not be supplied in the sixth operation ST6. Referring to FIG. 13, whether to supply the write current WC1 may be determined by the type of information reproduced immediately before supplying the write current WC1. Reproducing may be performed repeatedly until information being initially read and recorded in the first region d1 is present again in the second end E2 of the storage node SN1.

Figure 14:
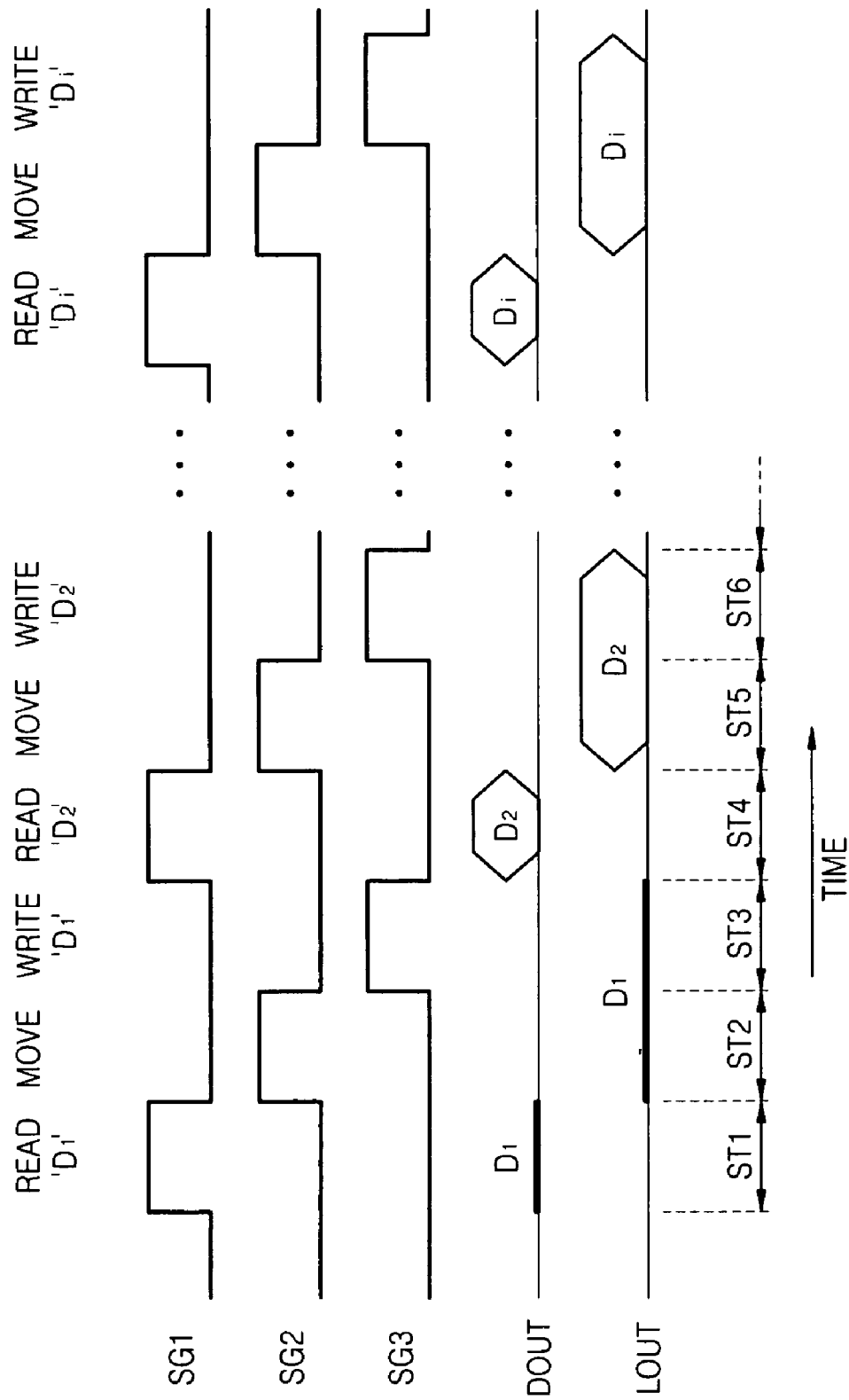
FIG. 14 is a waveform diagram of input signals and output signals used during reproduction (reading) of information stored in information storage devices according to example embodiments.

FIG. 14 is a waveform diagram of first through third input signals SG1 through SG3 and first and second output signals DOUT and LOUT generated during reproduction of information stored in an information storage device according to an example embodiment. FIGS. 9 and 13 will also be referred to as necessary when describing FIG. 14.

Referring to FIG. 14, first through sixth operations ST1 through ST6 may correspond to the first through sixth operations ST1 through ST6 of FIG. 13, respectively. In the first operation ST1, the first input signal SG1 may be input to the first transistor Tr1, and the information D, present in the second end E2 of the storage node SN1 illustrated in FIG. 12A (hereinafter referred to as first information) is reproduced. The first output signal DOUT output from the sense circuit S/A in response to the reproduced first information D, may be supplied to the temporary storage unit L1. In the second operation ST2, the second input signal SG2 may be supplied to the second transistor Tr2, and the magnetic domains and the magnetic domain walls may be moved by 1 bit. In this case, the second output signal LOUT may be maintained to correspond to the first information $D_1$. In the third operation ST3, the third input signal SG3 may be supplied to the logic device L2 via the second input terminal In2. When the third input signal SG3 is supplied to the logic device L2, an output signal of the logic device L2 may be determined by the type of the second output signal LOUT, thereby determining whether to supply the write current WC1. The write current WC1 may or may not be supplied. The first through third operation ST1 through ST3 may then be performed repeatedly.

FIGS. 15A through 15E are diagrams illustrating a method of reproducing information stored in the information storage device, according to another example embodiment. The information storage device used to illustrate this example embodiment has the same structure as the example embodiment shown in FIG. 4, except that a plurality of magnetic domains of a storage node SN1 are magnetized in given directions. In other words, given information is written to the magnetic domains. In this example embodiment, first and fourth word lines WL1 and WL4 may be connected via a common interconnecting wire and thus the same signal may be supplied thereto. Second and third word lines WL2 and WL3 may also be connected via a common interconnecting wire and thus the same signal may be supplied thereto. The information storage device illustrated in FIGS. 15A through 15E may be a part of the information storage device of FIG. 10. FIG. 10 will also be referred to as needed when describing the example embodiment shown in FIGS. 12A through 12E.

Figure 15A:
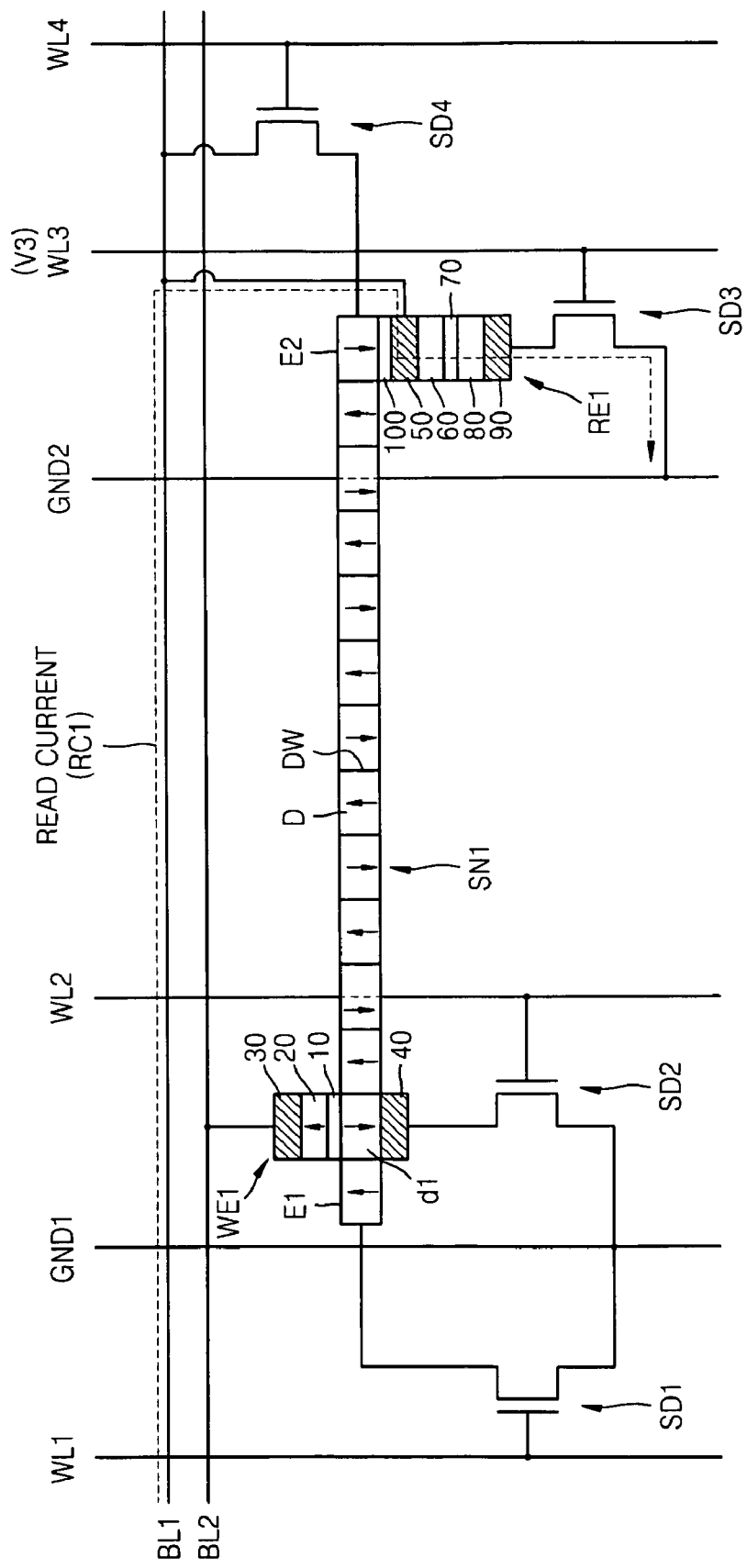
FIGS. 15A through 15E are diagrams illustrating a method of reproducing (reading) information stored in the information storage device according to another example embodiment.

Referring to FIG. 15A, information may be reproduced from a second end E2 of the storage node SN1 in a manner similar or substantially similar to that described with reference to FIG. 12A. The reproduced information may be temporarily stored in the temporary storage unit L1 of FIG. 10.

Figure 15B:
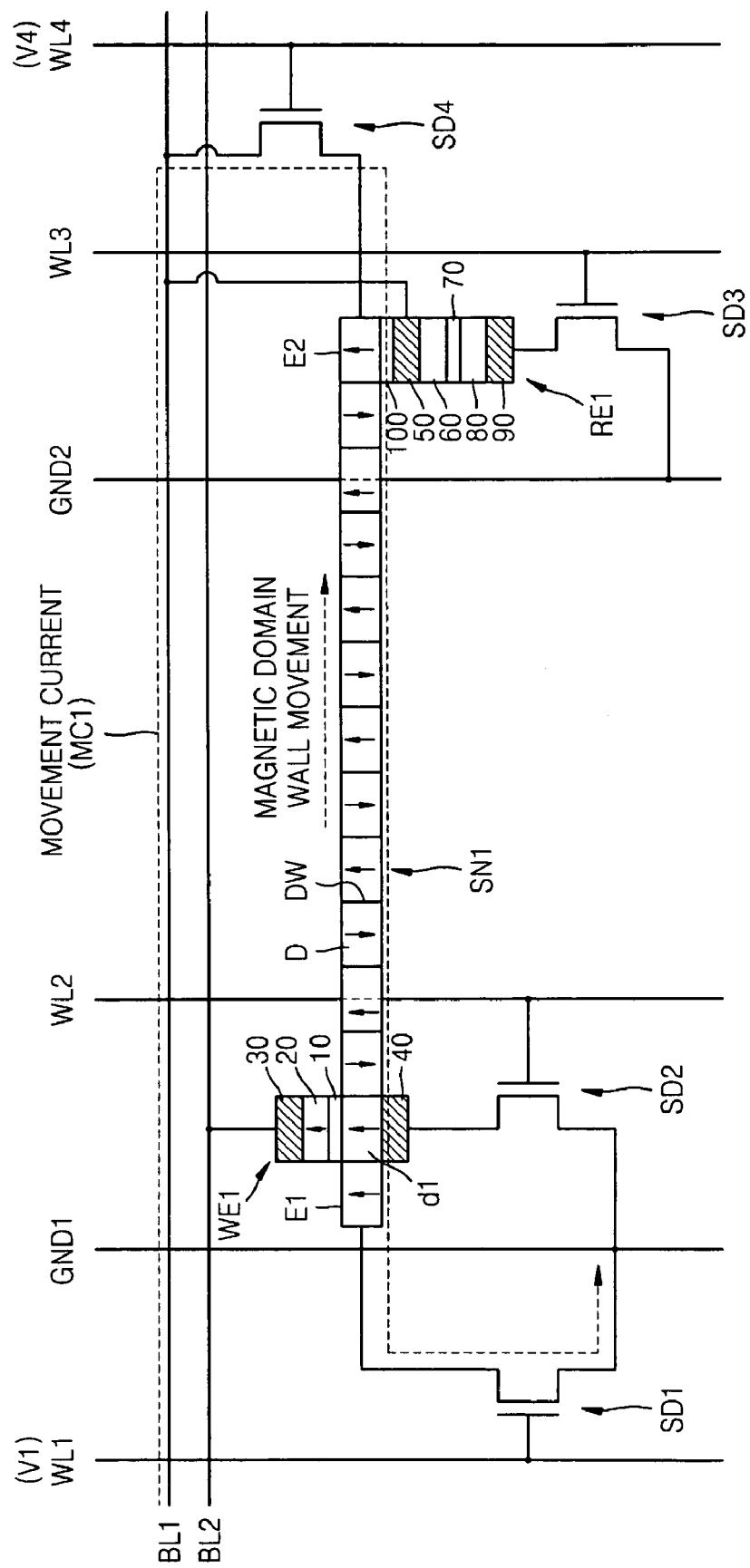

Referring to FIG. 15B, the magnetic domains and magnetic domain walls may be moved by 1 bit within the storage node SN1 toward a second end E2 of the storage node SN1, in a manner similar or substantially similar to that described with reference to FIG. 12B. In this case, the magnetic domain at a first end E1 of the storage node SN1 may extend to a first region d1 of the storage node SN1.

Figure 15C:
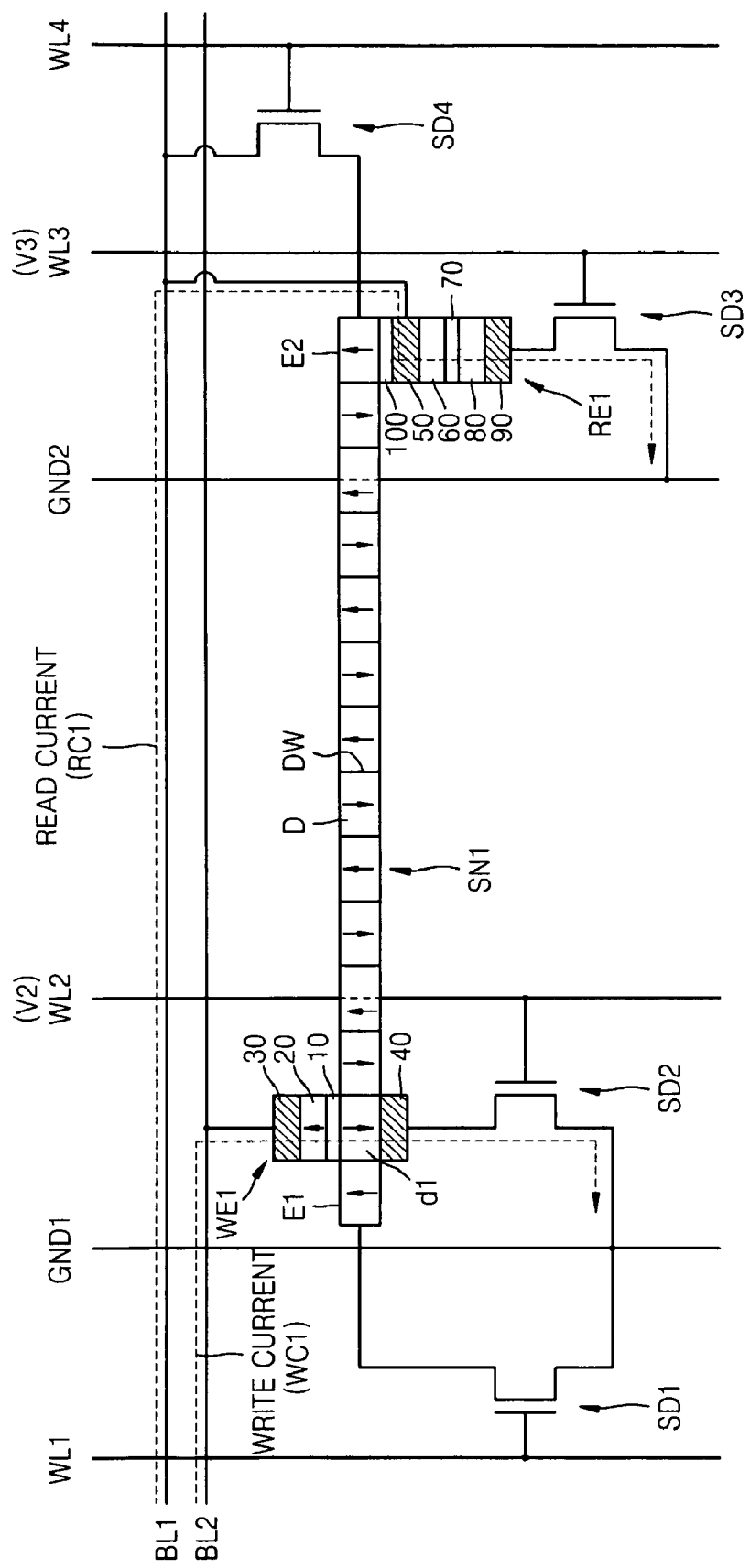

Referring to FIG. 15C, information stored in the second end E2 of the storage node SN1 may be reproduced in a manner similar or substantially similar to that described above with reference to FIG. 12D while writing the information to the first region d1 by applying a write current WC1. In this case, the information written to the first region d1 may be the same as the information being reproduced and temporarily stored in the temporary storage unit L1 as illustrated in FIG. 15A. As described above, in this example embodiment, nth information may be reproduced while recording information reproduced immediately before the $n^{th}$ information (e.g., $n-1^{th}$ information). In this example, n is a natural number greater than or equal to 2. Recording need not be performed when information is initially reproduced. If the $n-1^{th}$ information is a data value 1, the write current WC1 may be supplied in order to record this information to the first region d1 as illustrated in FIG. 15C. The write current WC1 may be supplied as described above with reference to FIG. 12C. If the $n-1^{th}$ information is a data value 0, the write current WC1 need not be supplied.

The information reproduced from the second end E2 of the storage node SN1 in FIG. 15C may be temporarily stored in the temporary storage unit L1 of FIG. 10. In one example, the information reproduced from the second end E2 may be the data value 0 and a signal corresponding to this information may be stored in the temporary storage unit L1.

Figure 15D:
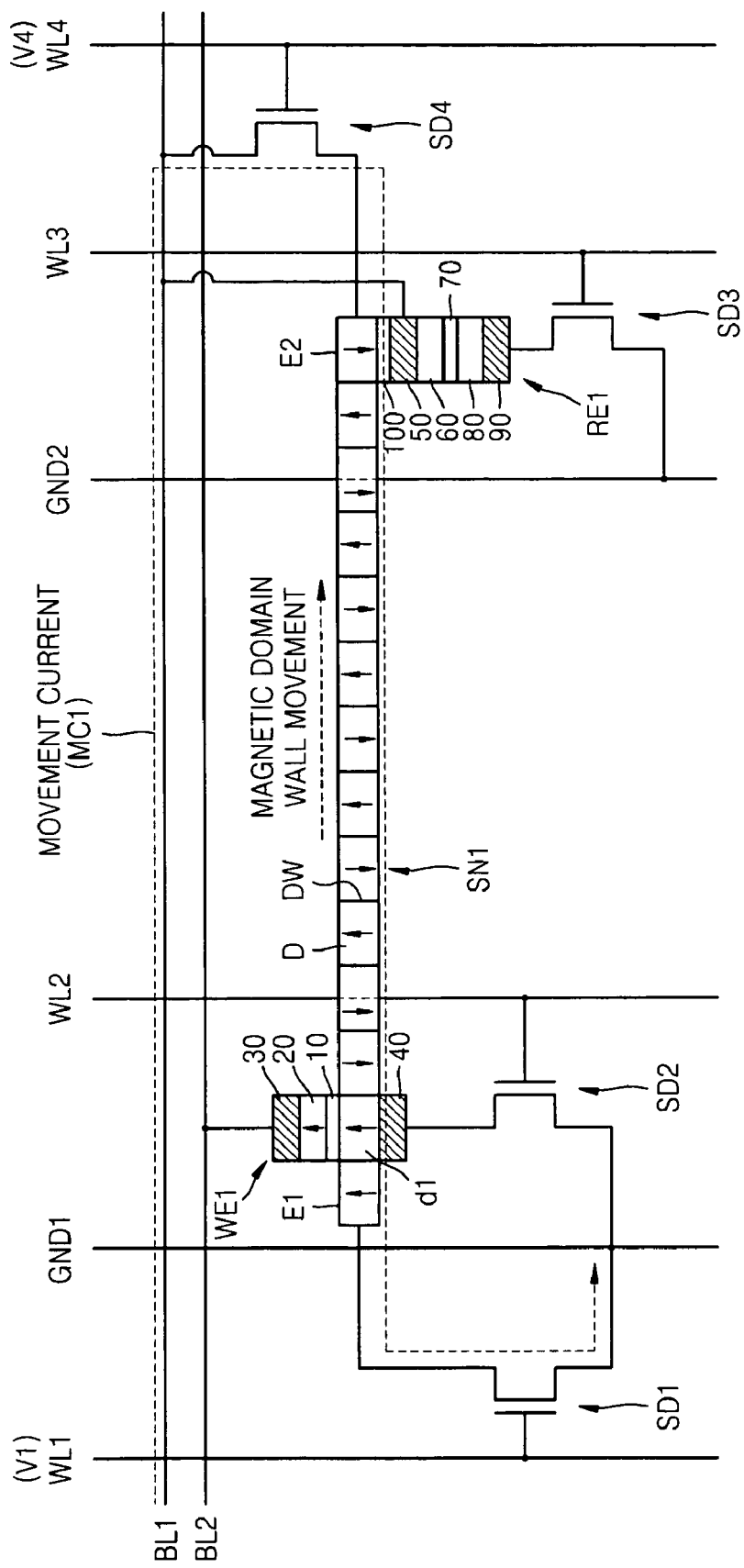

Referring to FIG. 15D, the magnetic domains and the magnetic domain walls may be moved by 1 bit within the storage node SN1 toward the second end E2 in a manner similar or substantially similar to that described with reference to FIG. 12E. The magnetic domain at the first end E1 of the storage node SN1 may extend to the first region d1.

Figure 15E:
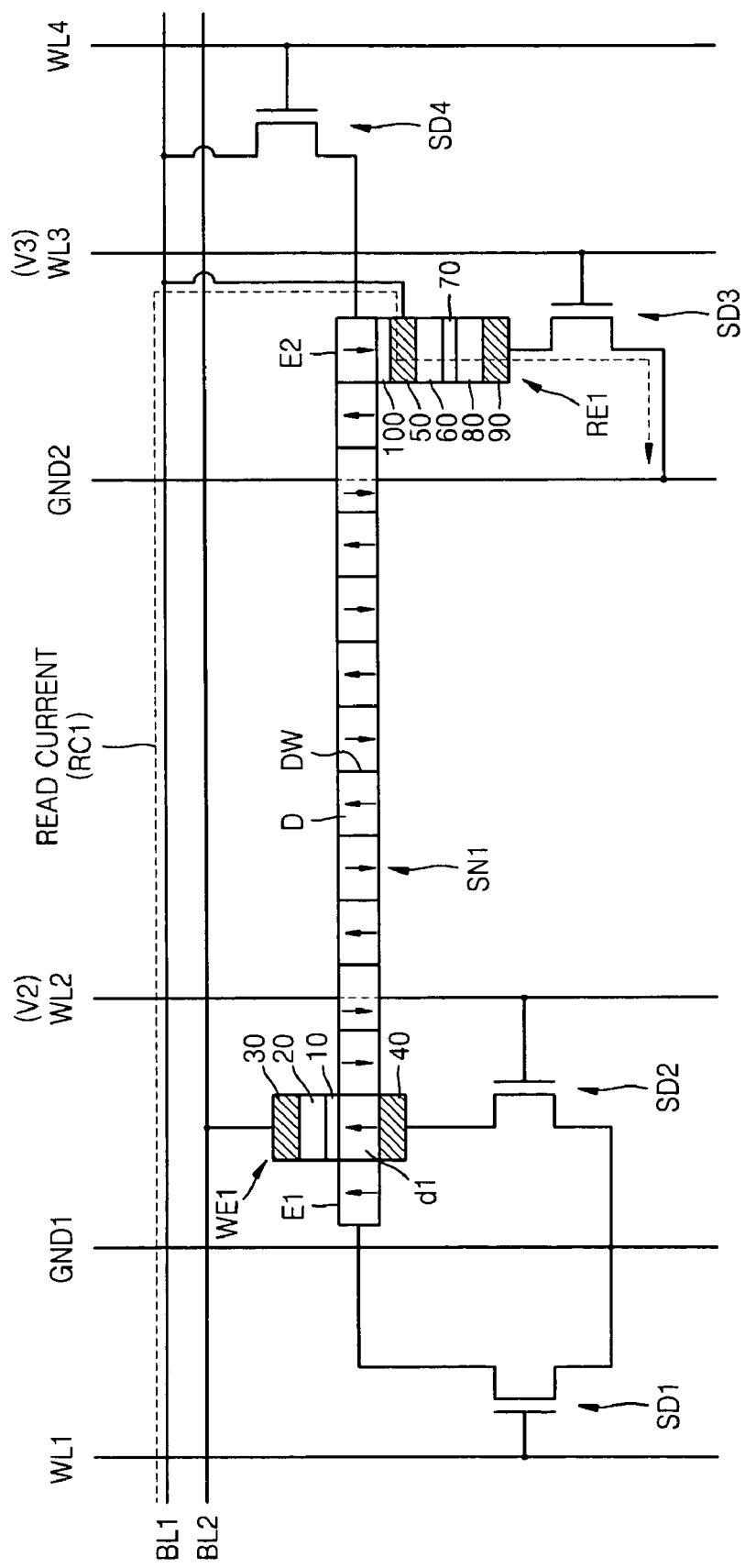

Referring to FIG. 15E, the information stored in the second end E2 of the storage node SN1 may be reproduced in a manner similar or substantially similar to that described with reference to FIG. 12E. The information reproduced and stored in the temporary storage unit L1 in FIG. 15C is the data value 0 and the magnetization of the first region d1 may correspond to the data value 0. As a result, the write current WC1 need not be supplied. Whether to supply the write current WC1 may be determined by the type of the information reproduced and stored in the temporary storage unit L1 in FIG. 15C.

It is possible to completely reproduce the information from the entire storage node SN1 except for the first end E1 thereof by repeatedly performing reproducing, recording (optional), and moving of the magnetic domains. Also, if the reproducing is completed, the storage node SN1 may return to its original state before the reproducing. For example, as illustrated in FIGS. 15A through FIG. 15E, recording and reading may be performed at the same or substantially the same time (e.g., concurrently or simultaneously), thereby increasing the speed of reading.

Figure 16:
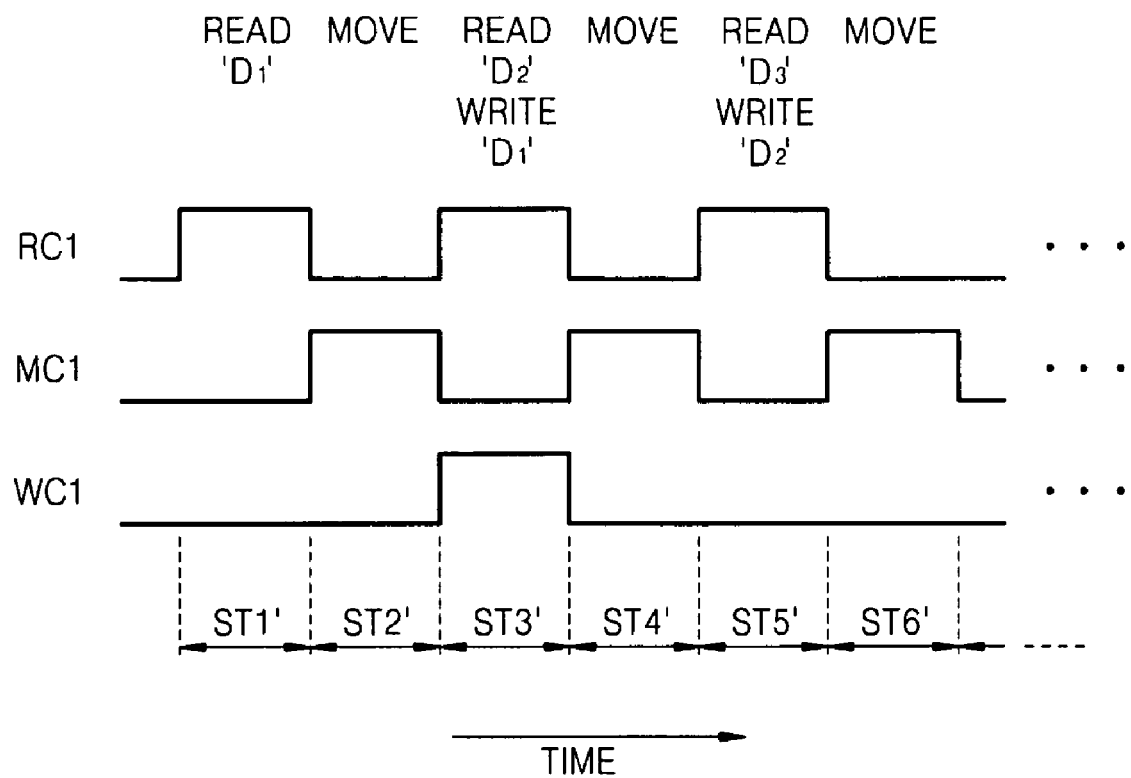
FIG. 16 is a waveform diagram of a read current, a movement current, a and write current which usable in reproducing (reading) information stored in information storage devices according to example embodiments.

FIG. 16 is a waveform diagram of a read current RC1, a movement current MC1, and a write current WC1, which may be used in reproducing information stored in an information storage device, according to another example embodiment.

Referring to FIG. 16, first through fifth operations ST1' through ST5' may correspond to the operations illustrated in FIGS. 15A through 15E, respectively. The read current RC1 may be supplied in the first operation ST1', the movement current MC1 may be supplied in the second operation ST2', and the read current RC1 and the write current WC1 may be supplied in the third operation ST3'. The movement current MC1 may be supplied in the fourth operation ST4', the read current RC1 may be supplied in the fifth operation ST5', and the movement current MC1 may be supplied in the sixth operation ST6'. Such a reading operation may be performed until information reproduced in the first operation ST1' and recorded in the first region d1 in the third operation ST3' is present again in the second end E2 of the storage node SN1.

Figure 17:
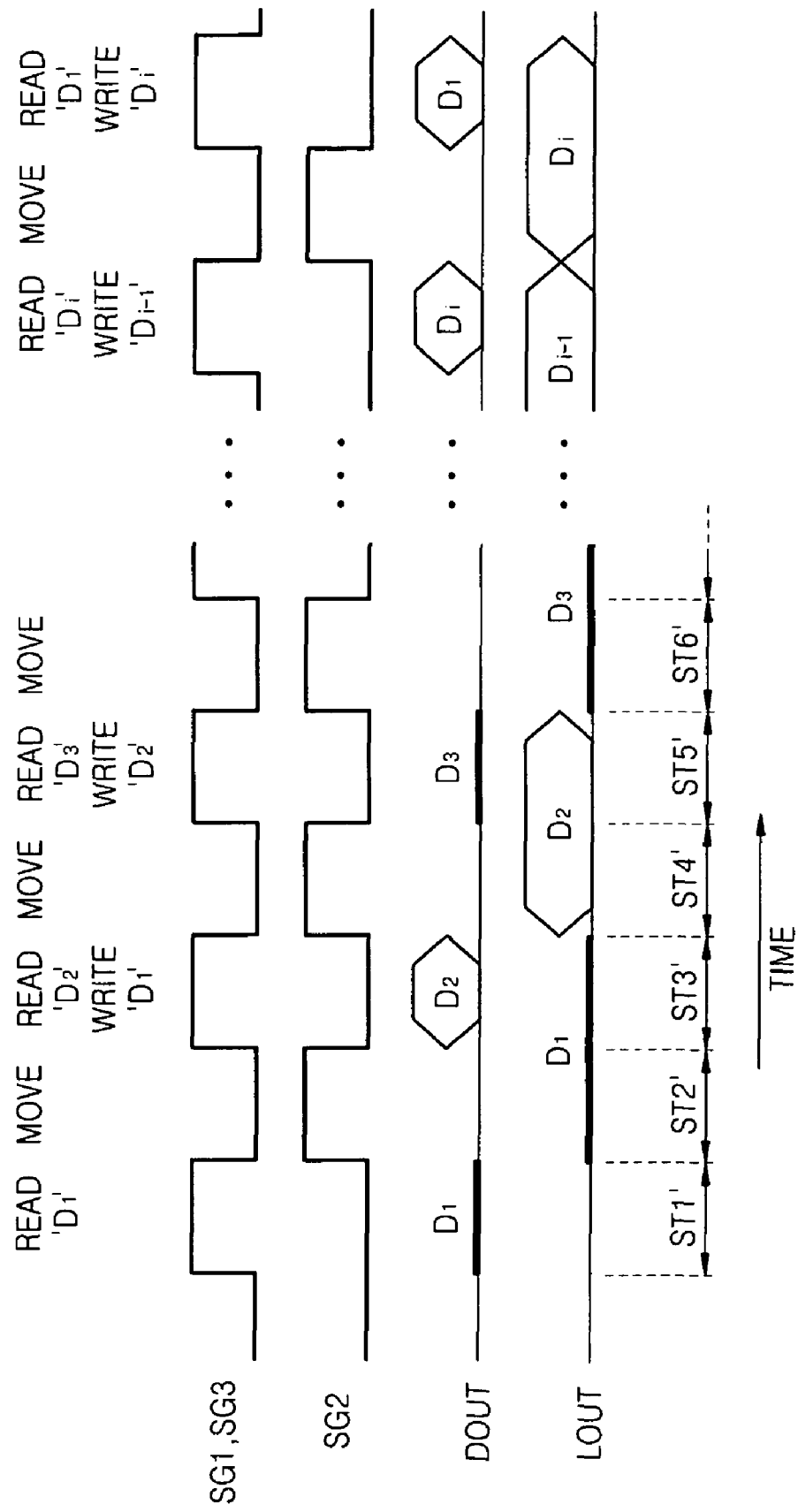
FIG. 17 is a waveform diagram of various input signals and output signals generated during reproduction (reading) of information stored in information storage devices according to example embodiments.

FIG. 17 is a waveform diagram of the first through third input signals SG1 through SG3 and the first and second output signals DOUT and LOUT illustrated in FIG. 10, which may be generated during reproduction of information stored in an information storage device according to an example embodiment. FIGS. 10 and 16 will also be referred to as necessary when describing FIG. 17.

Referring to FIG. 17, first through sixth operations ST1' through ST6' may respectively correspond to the first through sixth operations ST1' through ST6' of FIG. 16. In the first operation ST1', the first and third input signals SG1 and SG3 may be respectively input to the first transistor Tr1 and the logic device L2. First information (e.g., the information $D_1$ stored in the second end E2 of the storage node SN1 illustrated in FIG. 15A) may be reproduced in response to the first input signal SG1. The first output signal DOUT output from the sense circuit S/A in response to the reproduced first information D, may be supplied to the temporary storage unit L1. In the first operation ST1', the third input signal SG3 may be supplied to the logic device L2 while the second output signal LOUT is not output, and thus, the third transistor Tr3 may not be turned on and the write current WC1 is not supplied.

In the second operation ST2', the second input signal SG2 may be supplied to the second transistor Tr2, and thus, the magnetic domains and the magnetic domain walls may move by 1 bit. In this case, the second output signal LOUT may be maintained to correspond to the first information $D_1$.

In the third operation ST3', the first and third input signals SG1 and SG3 may be respectively supplied to the first transistor Tr1 and the logic device L2. Second information $D_2$ may be reproduced in response to the first input signal SG1, and the first output signal DOUT output from the sense circuit S/A in response to the second information $D_2$ may be supplied to the temporary storage unit L1. In the third operation ST3', when the third input signal SG3 is supplied to the logic device L2, a signal to be output from the logic device L2 may be determined by the type of the second output signal LOUT, thereby determining whether to supply the write current WC1. The write current WC1 may or may not be supplied. The second and third operations ST2' and ST3' may be performed repeatedly.

Example embodiments provide a buffer-free or reduced buffer information storage device in which the storage node SN1 may be entirely or substantially entirely used as an effective storage region. In methods of operating information storage devices according to example embodiments, recording and reproducing may be performed by moving magnetic domains and magnetic domain walls in only one direction. Thus, information storage devices according to example embodiments have higher reading/writing speeds and operating reliability, and improved performance when compared to conventional information storage devices in which magnetic domains and magnetic domain walls are moved to a buffer region and then returned back to the original storage region. Furthermore, according to example embodiments, all or substantially all necessary operations may be performed using a write current and a read current flowing in only one direction, respectively, thereby simplifying the process and circuit construction. Moreover, as described above with reference to FIGS. 15A through 15E, operating speed may be increased (e.g., greatly increased) when reproducing and reading are performed simultaneously or concurrently. In addition, if the fourth switching device SD4 and the read element RE1 are commonly connected to the first bit line BL1 as illustrated in FIG. 4, for example, if the first bit line BL1 is used as a common bit line, the degree of integration may be increased.

The specific terms used in the present disclosure are not intended to restrict the scope of the present invention and only used for a better understanding of (to facilitate the understanding of) the present invention. For example, it will be understood by those skilled in the art that various changes in form and details may be made in FIGS. 1 through 10 without departing from the spirit and scope of the present invention as defined by the appended claims. For example, the storage node SN1 may have horizontal magnetic anisotropy other than vertical magnetic anisotropy, and the pinned layer 20 of the write element WE1 and the pinned layer 60 of the read element RE1 may also have horizontal magnetic anisotropy. The structures of the write element WE1 and the read element RE1 are not limited to the above description and may be variously changed. Also, the methods described with reference to FIGS. 11A through 17 may be variously changed. Moreover, although the term "unit" is used in connection with certain elements of example embodiments, it will be understood that the term "circuit" may also be used. Further still, although the terms "recording," and "reproducing," are utilized most often, it will be understood that the term "writing," maybe used interchangeably with the term "recording," and the term "reading," may be used interchangeably with the term "reproducing." For example, the write control unit may be referred to as the write control circuit, etc. Accordingly, the scope of the present invention must be determined as defined in the claims and not by the above example embodiments.

What is claimed is:

1. An information storage device comprising:
   a storage node including a plurality of magnetic domain regions, and magnetic domain walls arranged between the magnetic domain regions;
   a write unit configured to write information to a first magnetic domain region of the storage node;
   a read unit configured to read information from a second magnetic domain region of the storage node;
   a magnetic domain wall moving unit electrically connected to the storage node, the magnetic domain wall moving unit being configured to move the magnetic domain walls;
   a temporary storage unit electrically connected to the read unit, the temporary storage unit being configured to temporarily store information read by the read unit; and
   a write control unit electrically connected to the temporary storage unit and the write unit, the write control unit being configured to control current supplied to the write unit.

2. The information storage device of claim 1, wherein the first magnetic domain region is adjacent to a first end of the storage node, and the second magnetic domain region corresponds to a second end of the storage node.

3. The information storage device of claim 2, wherein the first end of the storage node is magnetized in a given direction.

4. The information storage device of claim 1, further comprising:
   a plurality of word lines; and
   a plurality of bit lines intersecting the plurality of word lines; wherein
      a first end of the storage node is connected to a first of the plurality of word lines,
      a second end of the storage node is connected to one of a first and a second ones of the plurality of bit lines,
      a first electrode of the write unit is connected to a second of the plurality of word lines, the first electrode being disposed on a bottom of the first magnetic domain region,
      a second electrode of the write unit is connected to the second of the plurality of bit lines, the second electrode being disposed on a top of the first magnetic domain region,
      a first electrode of the read unit is connected to the first of the plurality of bit lines,
      a second electrode of the read unit is connected to a third of the plurality of word lines,
      the temporary storage unit is connected to the first of the plurality of bit lines, and the write control unit is connected to the second of the plurality of bit lines.

5. The information storage device of claim 4, further comprising:
   a first switching unit arranged between the first end of the storage node and the first of the plurality of word lines;
   a second switching unit arranged between the first electrode of the write unit and the second of the plurality of word lines; and
   a third switching unit arranged between the second electrode of the read unit and the third of the plurality of word lines.

6. The information storage device of claim 4, further comprising:
   a fourth switching unit arranged between the first or second of the plurality of bit lines, which is connected to the second end of the storage node, and the second end of the storage node; and wherein
   a fourth of the plurality of word lines is connected to the fourth switching unit.

7. The information storage device of claim 6, wherein the first and the fourth of the plurality of word lines are connected to a common voltage source.

8. The information storage device of claim 6, wherein the storage node, the plurality of word lines, the plurality of bit lines, and the first through fourth switching units form a unit memory region, a plurality of the unit memory regions being arranged to form a memory array.

9. The information storage device of claim 4, wherein the second of the plurality of word lines and the third of the plurality of word lines are connected to a common voltage source.

10. The information storage device of claim 9, further comprising:
    a peripheral circuit region configured to drive and control the memory array, wherein
       the magnetic domain wall moving unit, the temporary storage unit, and the write control unit are included in the peripheral circuit region; and
       a decoder arranged between the memory array and the peripheral circuit region.

11. The information storage device of claim 4, wherein the second end of the storage node is connected to the first of the plurality of bit lines, and the magnetic domain wall moving unit is connected to the first of the plurality of bit lines.

12. The information storage device of claim 1, wherein the magnetic domain wall moving unit includes,
    a current source configured to supply current to the storage node; and
    a switching unit connected between the storage node and the current source.

13. The information storage device of claim 1, further comprising:
    a sense unit connected between the temporary storage unit and the read unit.

14. The information storage device of claim 13, wherein the temporary storage unit includes,
    a latch connected to an output terminal of the sense unit.

15. The information storage device of claim 1, wherein the write control unit includes,
    a current source configured to supply current to the write unit,
    a switching unit connected between the current source and the write unit, and
    a logic device connected between the switching unit and the temporary storage unit.

16. A method of operating the information storage device of claim 1 comprising:
    a first operation of reading information from the second magnetic domain region and storing the read information in the temporary storage unit; and
    a second operation of moving the magnetic domain walls of the storage node toward the second magnetic domain region.

17. The method of claim 16, further comprising:
    a third operation of selectively writing information to the first magnetic domain region.

18. The method of claim 17, wherein the information written to the first magnetic domain region in the third operation is the same as the information read in the first operation.

19. The method of claim 17, wherein the first magnetic domain region is adjacent to a first end of the storage node, the second magnetic domain region corresponds to a second end of the storage node, and the first end of the storage node is a third magnetic domain region magnetized in a first direction.

20. The method of claim 19, wherein, in the second operation, the third magnetic domain region extends to the first magnetic domain region, and if the information read in the first operation corresponds to information stored in the third magnetic domain region, a write current is not supplied to the first magnetic domain region in the third operation.

21. The method of claim 19, wherein the third magnetic domain region extends to the first magnetic domain region in the second operation, and if the information read in the first operation does not correspond to information stored in the third magnetic domain region, a write current is supplied to the first magnetic domain region in the third operation.

22. The method of claim 16, wherein after the second operation, the method further comprises:
    a third operation of selectively writing the information read in the first operation to the first magnetic domain region concurrently with reading of the information from the second magnetic domain region.

23. The method of claim 22, wherein the first magnetic domain region is adjacent to a first end of the storage node, the second magnetic domain region corresponds to a second end of the storage node, and the first end of the storage node is a magnetic domain magnetized in a first direction.

24. The method of claim 23, wherein, if the information read in the first operation corresponds to information stored in the first end of the storage node, a write current is not supplied to the first magnetic domain region in the third operation, and if the information read in the first operation does not correspond to information stored in the first end of the storage node, the write current is supplied to the first magnetic domain region in the third operation.

25. An information storage device comprising:
   a storage node including a plurality of magnetic domains, a magnetic domain wall being arranged between each pair of adjacent magnetic domains;
   a write unit arranged at a first magnetic domain region of the storage node adjacent to a first end of the storage node, wherein the first end of the storage node is magnetized in a first magnetization direction; and
   a read unit arranged at a second magnetic domain region of the storage node, wherein the second magnetic domain region is at a second end of the storage node.

26. The information storage device of claim 25, wherein the first magnetization direction represents a first information type, and the write unit is configured to write information to the first magnetic domain region by selectively applying a write current to the first magnetic domain region, the information corresponding to the first or a second magnetization direction.

27. The information storage device of claim 26, wherein the write unit applies the write current to the first magnetic domain region only if the information corresponds to the second magnetization direction.

28. The information storage device of claim 25, wherein the write unit and the read unit are connected to different bit lines.

29. The information storage device of claim 25, wherein the write unit and the read unit are connected to a common bit line.

30. The information storage device of claim 25, further comprising:
   a plurality of word lines; and
   a plurality of bit lines intersecting the plurality of word lines; wherein
      a first end of the storage node is connected to a first of the plurality of word lines,
      a second end of the storage node is connected to one of a first and a second ones of the plurality of bit lines,
      a first electrode of the write unit is connected to a second of the plurality of word lines,
      a second electrode of the write unit is connected to the second of the plurality of bit lines,
      a first electrode of the read unit is connected to one of the first and second of the plurality of bit lines,
      a second electrode of the read unit is connected to a third of the plurality of word lines.

31. The information storage device of claim 30, further comprising:
   a first switching unit arranged between the first end of the storage node and the first of the plurality of word lines;
   a second switching unit arranged between the first electrode of the write unit and the second of the plurality of word lines; and
   a third switching unit arranged between the second electrode of the read unit and the third of the plurality of word lines.

32. The information storage device of claim 31, further comprising:
   a fourth switching unit arranged between the first or second of the plurality of bit lines, which is connected to the second end of the storage node, and the second end of the storage node; wherein
      a fourth of the plurality of word lines is connected to the fourth switching unit.

33. The information storage device of claim 25, further comprising:
   a magnetic domain wall moving unit electrically connected to the storage node, the magnetic domain wall moving unit being configured to move the magnetic domain walls;
   a temporary storage unit electrically connected to the read unit, the temporary storage unit being configured to temporarily store information read by the read unit; and
   a write control unit electrically connected to the temporary storage unit and the write unit, the write control unit being configured to control current supplied to the write unit.

34. The information storage device of claim 33, further comprising:
   a sense unit connected between the temporary storage unit and the read unit.

35. The information storage device of claim 34, wherein the temporary storage unit includes a latch connected to an output terminal of the sense unit.

36. The information storage device of claim 33, wherein the write control unit includes,
   a current source configured to supply current to the write unit,
   a switching unit connected between the current source and the write unit, and
   a logic device connected between the switching unit and the temporary storage unit.

37. The information storage device of claim 25, wherein the write unit is arranged on the first magnetic domain region, and the first magnetic domain region is adjacent to an end magnetic domain region at the first end of the storage node.

38. A method of operating the information storage device of claim 25, wherein the first end of the storage node is an end magnetic domain region magnetized in the first magnetization direction, the method comprising:
   recording first information by magnetizing the first magnetic domain region in a direction opposite to the first magnetization direction; and
   moving the first information toward the second end of the storage node to an adjacent second magnetic domain region of the storage node while extending the end magnetic domain region to the first magnetic domain region by supplying current to the storage node.

* * * * *